(12) United States Patent
Takano

(10) Patent No.: US 9,589,819 B1
(45) Date of Patent: Mar. 7, 2017

(54) SUBSTRATE PROCESSING APPARATUS

(71) Applicant: HITACHI KOKUSAI ELECTRIC INC., Tokyo (JP)

(72) Inventor: Satoshi Takano, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/066,081

(22) Filed: Mar. 10, 2016

(30) Foreign Application Priority Data

Sep. 29, 2015 (JP) ................................ 2015-191269

(51) Int. Cl.
*H01L 21/67* (2006.01)
*H01L 21/687* (2006.01)

(52) U.S. Cl.
CPC .. *H01L 21/67196* (2013.01); *H01L 21/67109* (2013.01); *H01L 21/67207* (2013.01); *H01L 21/67248* (2013.01); *H01L 21/68764* (2013.01); *H01L 21/68792* (2013.01)

(58) Field of Classification Search
CPC ......... H01L 21/67109; H01L 21/67742; H01L 21/6719; H01L 21/67196; H01L 21/67115
See application file for complete search history.

(56) References Cited

U.S. PATENT DOCUMENTS

| | | | | |
|---|---|---|---|---|
| 6,742,977 B1* | 6/2004 | Okayama | .......... | H01L 21/67742 118/719 |
| 6,986,261 B2* | 1/2006 | Sasaki | ............... | H01L 21/67167 165/268 |
| 7,748,138 B2* | 7/2010 | Moriya | ............. | H01L 21/67103 118/719 |
| 8,326,468 B2* | 12/2012 | Kondoh | .................... | B25J 19/00 414/935 |
| 9,259,841 B2* | 2/2016 | Shimada | .................. | B25J 9/043 |
| 2009/0118872 A1* | 5/2009 | Nonaka | .............. | G05D 23/1934 700/285 |
| 2012/0034570 A1* | 2/2012 | Yasui | .................. | F27B 17/0025 432/1 |
| 2013/0180448 A1* | 7/2013 | Sakaue | ............. | H01L 21/67739 118/696 |

(Continued)

FOREIGN PATENT DOCUMENTS

| JP | 07-086371 A | 3/1995 |
|---|---|---|
| JP | 2010-171344 A | 8/2010 |

(Continued)

*Primary Examiner* — Kaitlin Joerger
(74) *Attorney, Agent, or Firm* — Volpe and Koenig, P.C.

(57) ABSTRACT

A substrate processing apparatus includes a robot having: an end effector, a first link structure including a fixing portion having a front end to which the end effector is fixed, a support portion, and a first hole formed in the support portion, a second link structure including a second hole, and a shaft inserted into the first and second holes, the shaft including an upper end having a height equal to or smaller than a height of the substrate mounted on the end effector; a vacuum transfer chamber, wherein the robot is installed in the vacuum transfer chamber; at least one process chamber disposed adjacent to the vacuum transfer chamber and configured to thermally process the substrate transferred from the vacuum transfer chamber by the robot; a module including one or more process chambers; and a cooling mechanism installed above the first link structure or the shaft.

18 Claims, 16 Drawing Sheets

(56) References Cited

U.S. PATENT DOCUMENTS

| | | | |
|---|---|---|---|
| 2014/0235068 A1* | 8/2014 | Ashihara | H01L 21/02164 438/771 |
| 2015/0133044 A1* | 5/2015 | Kumagai | H01L 21/67109 454/284 |
| 2015/0371883 A1* | 12/2015 | Takahashi | H01L 21/67259 438/5 |

FOREIGN PATENT DOCUMENTS

| | | |
|---|---|---|
| JP | 2011-061149 A | 3/2011 |
| JP | 2012-054536 A | 3/2012 |

\* cited by examiner

FIG. 16

Table 1

|  | Vacuum transfer mode | Cooling mode |
|---|---|---|
| Heat transfer gas supply part | Not supplied | Supplied |
| Pressure | $\alpha\ (<\beta)$ | $\beta\ (>\alpha)$ |

Table 2

|  | Vacuum transfer mode | Cooling mode |
|---|---|---|
| Heat transfer gas supply part | Not supplied | Supplied |
| Pressure | $\alpha\ (<\beta)$ | $\beta\ (>\alpha)$ |
| Arm position | Transfer position | Standby position |

Table 3

| Temperature T1 ( < T2) | Vacuum transfer mode |
|---|---|
| Temperature T2 ( < T1) | Cooling mode |

Table 4

| Transfer times = N times or less | Vacuum transfer mode |
|---|---|
| Transfer times = more than N times | Cooling mode |

SUBSTRATE PROCESSING APPARATUS

CROSS-REFERENCE TO RELATED APPLICATION

This application is based upon and claims the benefit of priority from Japan Patent Applications No. 2015-191269, filed on Sep. 29, 2015, the entire contents of which are incorporated herein by reference.

TECHNICAL FIELD

The present disclosure relates to a substrate processing apparatus, a method of manufacturing a semiconductor device, and a recording medium.

BACKGROUND

For example, a substrate processing apparatus such as a semiconductor manufacturing apparatus for performing a predetermined process with respect to a semiconductor substrate includes a module which performs a film forming process, a heat treatment or the like with respect to a substrate transferred from a higher-level apparatus. The transfer of the substrate is performed by, for example, a transfer robot disposed in a vacuum transfer chamber. In the aforementioned apparatus, there is required an ability to form a high-quality film at high throughput. For example, processing a substrate at a high temperature may be used as a method of providing a high-quality film. However, when repeatedly performing a process, the temperature of a substrate is accumulated in a transfer robot. Thus, deformation or the like of the components that constitute the transfer robot may occur. The deformation of the components may become a cause of frequent maintenance or the like. This poses a problem of reduction of throughput.

SUMMARY

The present disclosure provides some embodiments of a technique capable of maintaining high throughput even when processing a substrate at a high temperature.

According to one embodiment of the present disclosure, there is provided a structure, including: a robot including an end effector configured to support a substrate, a first link structure including a fixing portion having a front end to which the end effector is fixed, support portion configured to support the fixing portion and a first hole formed in the support portion, a second link structure including a second hole, and a shaft inserted into the first hole and the second hole to interconnect the first link structure and the second link structure, the shaft including an upper end having a height equal to or smaller than a height of the substrate mounted on the end effector; a vacuum transfer chamber, wherein the robot is installed in the vacuum transfer chamber; at least one process chamber disposed adjacent to the vacuum transfer chamber and configured to thermally process the substrate transferred from the vacuum transfer chamber by the robot; a module including one or more process chambers; and a cooling mechanism installed above the first link structure or the shaft and configured to cool the first link structure or the shaft.

BRIEF DESCRIPTION OF THE DRAWINGS

FIG. 16 shows tables storing operations corresponding to a vacuum transfer mode and a cooling mode.

DETAILED DESCRIPTION

First Embodiment

A first embodiment of the present disclosure will now be described. Hereinafter, a substrate processing apparatus according to the present embodiment will be described.

(1) Configuration of Substrate Processing Apparatus

Figure 1:
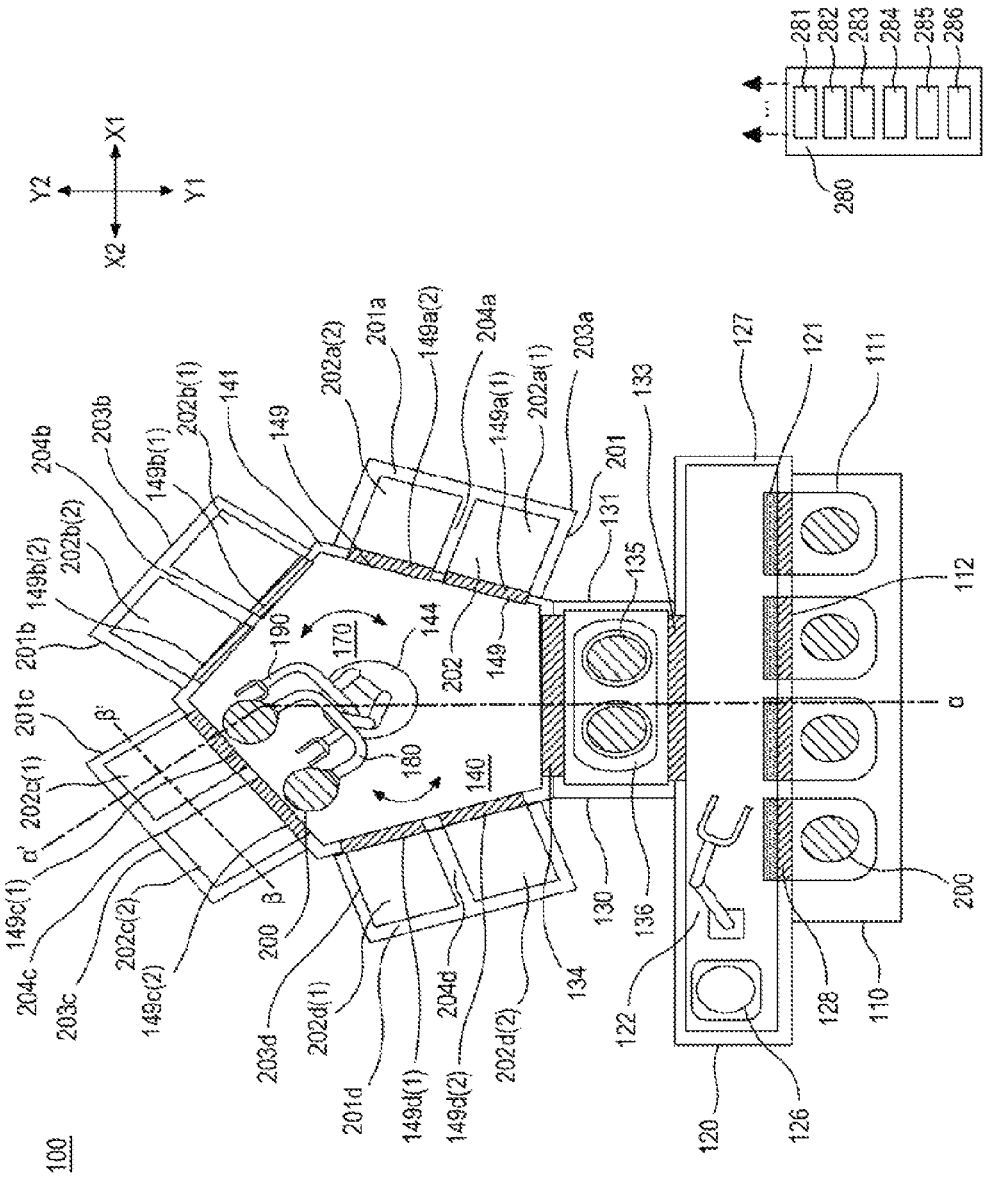
FIG. 1 is a horizontal sectional view illustrating a configuration example of a substrate processing apparatus according to an embodiment of the present disclosure.
Figure 2:
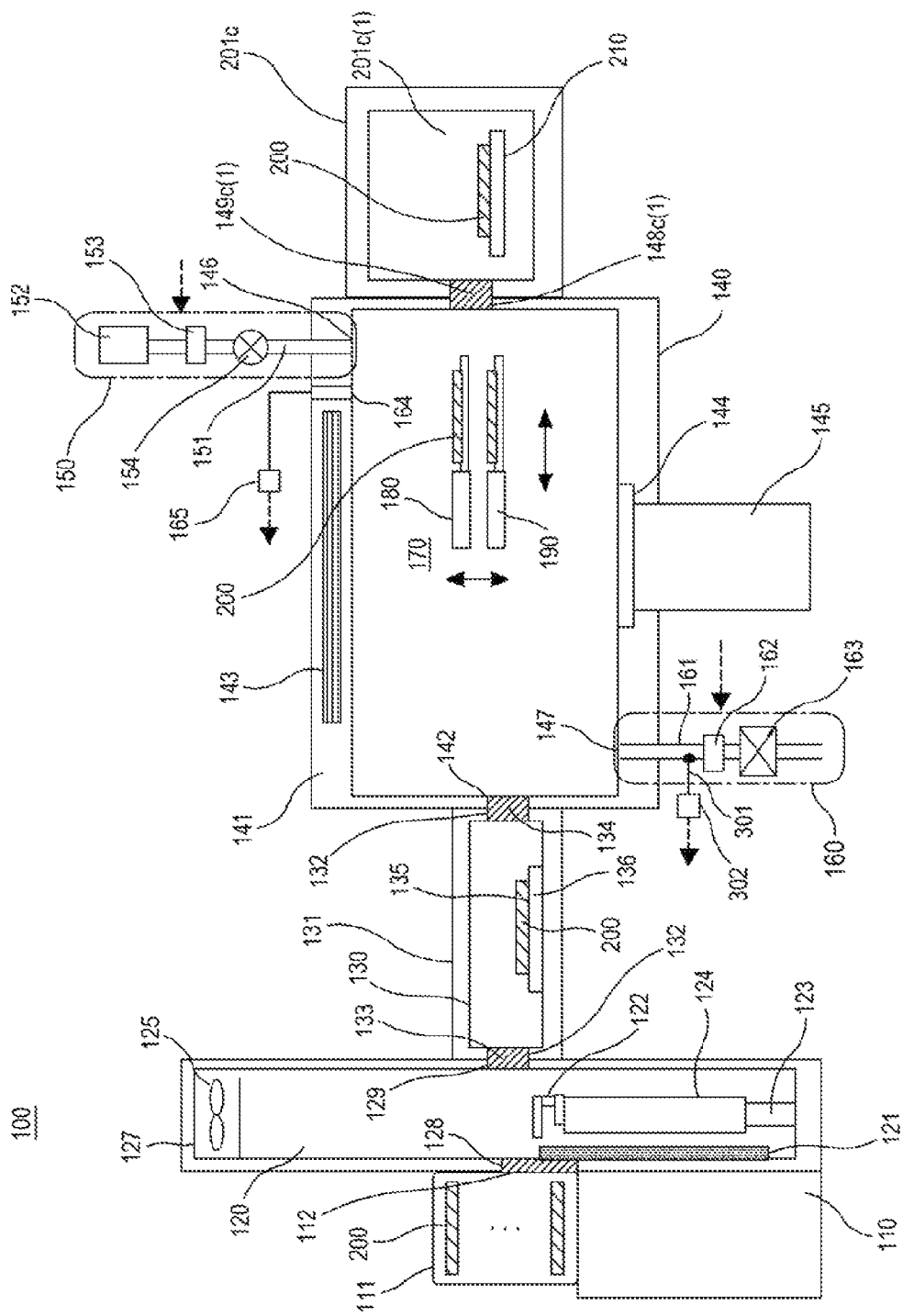
FIG. 2 is a vertical sectional view illustrating a configuration example of a substrate processing apparatus according to an embodiment of the present disclosure.

A schematic configuration of a substrate processing apparatus according to a first embodiment of the present disclosure will be described with reference to FIGS. 1 and 2. FIG. 1 is a horizontal sectional view illustrating a configuration example of a substrate processing apparatus according to the present embodiment. FIG. 2 is a vertical sectional view taken along line α-α' in FIG. 1, illustrating the configuration example of the substrate processing apparatus according to the present embodiment.

Referring to FIGS. 1 and 2, the substrate processing apparatus 100 to which the present disclosure is applied is configured to process wafers 200 as substrates. The substrate processing apparatus 100 is mainly configured by an IO stage 110, an atmospheric transfer chamber 120, a load lock chamber 130, a vacuum transfer chamber 140, and modules 201. Next, the respective configurations will be described in detail. In the descriptions of FIG. 1, the X1 direction is the right side, the X2 direction is the left side, the Y1 direction is the front side, and the Y2 direction is the rear side.

(Atmosphere Transfer Chamber and IO Stage)

The IO stage (load port) 110 is installed at the front side of the substrate processing apparatus 100. A plurality of pods 111 is mounted on the IO stage 110. The pods 111 are used as carriers that carry wafers 200 such as silicon (Si) substrates or the like. Within the pods 111, unprocessed wafers 200 or processed wafers 200 are stored in a horizontal posture.

A cap 112 is installed in each of the pods ill and is opened or closed by a pod opener 121 which will be described in detail below. The pod opener 121 opens or closes the cap 112 of each of the pods 111 mounted on the IO stage 110, and opens or closes a substrate loading/unloading opening of each of the pods 111, thereby enabling the wafers 200 to be loaded into or unloaded from each of the pods 111. The pods 111 are supplied to and discharged from the IO stage 110 by an automated material handling system (AMHS; not shown).

The IO stage 110 is adjacent to the atmospheric transfer chamber 120. The load lock chamber 130, which will be described in detail below, is connected to the surface of the atmospheric transfer chamber 120 opposite to the IO stage 11.

An atmospheric transfer robot 122 that transfers the wafers 200 is installed within the atmospheric transfer chamber 120. As shown in FIG. 2, the atmospheric transfer robot 122 is configured to be moved up and down by an elevator 123 installed in the atmospheric transfer chamber 120, and to be reciprocated in a left-right direction by a linear actuator 124.

A clean unit 125 that supplies clean air is installed in the upper portion of the atmospheric transfer chamber 120. A device (hereinafter referred to as a pre-aligner) 126 which aligns a notch or an orientation flat formed in the wafer 200 is installed at the left side of the atmospheric transfer chamber 120.

At the front side of a housing 127 of the atmospheric transfer chamber 120, there are provided a substrate loading/unloading gate 128 for loading and unloading the wafer 200 into and from the atmospheric transfer chamber 120 and a pod opener 121. The IO stage (load port) 110 is installed at the opposite side of the substrate loading/unloading gate 128 from the pod opener 121, i.e., at the outer side of the housing 127.

At the rear side of the housing 127 of the atmospheric transfer chamber 120, there is provided a substrate loading/unloading gate 129 for loading and unloading the wafer 200 into and from the load lock chamber 130. The substrate loading/unloading gate 129 is opened and closed by a gate valve 133 so that the wafers 200 may be loaded and unloaded.

(Load Lock Chamber)

The load lock chamber 130 is adjacent to the atmospheric transfer chamber 120. As will be described below, the vacuum transfer chamber 140 is disposed on one of the surfaces of a housing 131 defining the load lock chamber 130, which is opposite to the atmospheric transfer chamber 120. Since the internal pressure of the housing 131 varies depending on the pressure of the atmospheric transfer chamber 120 and the pressure of the vacuum transfer chamber 140, the load lock chamber 130 is configured to have a structure capable of withstanding a negative pressure.

A substrate loading/unloading gate 132 is provided on the surface of the housing 131 that adjoins the vacuum transfer chamber 140. The substrate loading/unloading gate 132 is opened and closed by a gate valve 134 so that the wafers 200 may be loaded and unloaded.

Furthermore, a substrate mounting table 136 including at least two substrate mounting surfaces 135 for mounting the wafers 200 is installed within the load lock chamber 130. The distance between the substrate mounting surfaces 135 is set depending on the distance between end effectors of an arm of a robot 170 which will be described in detail below.

(Vacuum Transfer Chamber)

The substrate processing apparatus 100 includes a vacuum transfer chamber (transfer module) 140 serving as a transfer chamber that forms a transfer space in which the wafers 200 are transferred under a negative pressure. A housing 141 that defines the vacuum transfer chamber 140 is formed to have a pentagonal shape in a plane view. The load lock chamber 130 and the modules 201a to 201d for processing the wafers 200 are connected to the respective sides of the pentagon. In the substantially central portion of the vacuum transfer chamber 140, a robot 170 as a transfer robot for transferring the wafers 200 under a negative pressure is installed using a flange 144 as a base.

A substrate loading/unloading gate 142 is provided in one of the sidewalls of the housing 141, which adjoins the load lock chamber 130. The substrate loading/unloading gate 142 is opened and closed by a gate valve 134 so that the wafers 200 may be loaded and unloaded.

A cooling plate 143 configured as a cooling mechanism is embedded in a wall constituting the ceiling of the housing 141 and is disposed above a horizontal operation region of an arm 180. The cooling plate 143 has a size capable of covering the operation range of the arm 180. Specifically, the cooling plate 143 is installed at least between a shaft 188 of the arm 180 and a substrate loading/unloading gate 148 of a below-mentioned process chamber 202 in a horizontal direction. More specifically, in a cooling mode which will be described later, the cooling plate 143 is installed above a region where end effectors 181 and 182 of the arm 180 of the robot 170 and a first link structure 183 are disposed.

As will be described in detail below, along with the tendency of high throughput of the substrate processing apparatus, there may be a case where the wafers 200 processed in the process chamber 202 are directly transferred into the vacuum transfer chamber 140 in a high temperature state. Even in this case, the components of the robot 170 may be cooled by the cooling plate 143. Thus, the transfer throughput may not be deteriorated.

A vacuum transfer robot 170 installed within the vacuum transfer chamber 140 is configured to be moved up and down by an elevator 145 and a flange 144 while maintaining the air-tightness of the vacuum transfer chamber 140. Two arms 180 and 190 of the robot 170 are configured to move up and down. In FIG. 2, for the sake of convenience in description, the end effectors of the arms 180 and 190 are illustrated and the first link structure and the like as other structures are omitted. Details of the arms 180 and 190 will be described below.

A heat transfer gas supply hole 146 for supplying a heat transfer gas into the housing 141 is formed in the ceiling of the housing 141 at a location different from the location of the cooling plate 143. A heat transfer gas supply pipe 151 is installed in the heat transfer gas supply hole 146. A heat transfer gas source 152, a mass flow controller 153, and a valve 154 are installed in the heat transfer gas supply pipe 151 in the named order from the upstream side, thereby controlling a supply amount of a heat transfer gas supplied into the housing 141. A gas that does not affect films formed on the wafer 200 and has high heat conductivity is used as the heat transfer gas. For example, a helium Me) gas, a nitrogen ($N_2$) gas, or a hydrogen ($H_2$) gas is used as the heat transfer gas.

A heat transfer gas supply part 150 for the vacuum transfer chamber 140 is mainly configured by the heat transfer gas supply pipe 151, the mass flow controller 153, and the valve 154. Furthermore, the heat transfer gas source 152 and the gas supply hole 146 may be included in the heat transfer gas supply part 150.

The heat transfer gas supply part 150 is electrically connected to a controller 280. In FIG. 2, the connection to the controller is indicated by a dot-line arrow. More specifically, the controller 280 is electrically connected to the mass flow controller 153 and the valve 154. The mass flow controller 153 and the valve 154 are controlled by an instruction of the controller 280.

An exhaust hole 147 for exhausting an internal atmosphere of the housing 141 is formed in the bottom wall of the housing 141. An exhaust pipe 161 is installed in the exhaust hole 147. An auto pressure controller (APC) 162 as a pressure controller and a valve 163 are installed in the exhaust pipe 161 in the named order from the upstream side.

A gas exhaust part 160 for the vacuum transfer chamber 140 is mainly configured by the exhaust pipe 161 and the APC 162. The valve 163 and the exhaust hole 147 may also be included in the gas exhaust part.

The atmosphere of the vacuum transfer chamber 140 is controlled by the cooperation of the gas supply part 150 and the gas exhaust part 160. For example, the internal pressure of the housing 141 is controlled.

The gas exhaust part 160 is electrically connected to the controller 280. In FIG. 2, the connection to the controller is indicated by a dot-line arrow. More specifically, the controller 280 is electrically connected to the APC 162 and the valve 163. The APC 162 and the valve 163 are controlled by an instruction of the controller 280.

A pressure detecting mechanism 301 is installed in the exhaust pipe 161 to detect the internal pressure of the vacuum transfer chamber 140. A pressure monitoring part 302 is connected to the pressure detecting mechanism 301 to monitor a pressure valve detected by the pressure detecting mechanism 301. The pressure monitoring part 302 is electrically connected to the controller 280. A monitored pressure value is transmitted to the controller 280.

As illustrated in FIG. 1, modules (process modules) 201a, 201b, 201c, and 201d for performing desired processes with respect to the wafers 200 are connected to four of five sidewalk of the housing 141 on which the load lock chamber 130 is not installed.

Process chambers 202 are provided in the respective modules 201a, 201b, 201c, and 201d. Specifically, process chambers 202a(1) and 202a(2) are provided in the module 201a. Process chambers 202b(1) and 202b(2) are provided in the module 201b. Process chambers 202c(1) and 202c(2) are provided in the module 201.c. Process chambers 202d(1) and 202d(2) are provided in the module 201d.

In order to prevent the atmospheres of below-mentioned processing spaces 205 from being mixed with each other, a partition wall 204 is installed between the two process chambers 202 provided in the modules 201, thereby keeping the respective process chambers in independent atmospheres.

Substrate loading/unloading gates 148 are provided in the sidewalk of the housing 141 facing toward the respective process chambers. For example, as illustrated in FIG. 2, a substrate loading/unloading gate 148c(1) is provided in the sidewall facing toward the process chamber 202c(1).

In FIG. 2, if the process chamber 202c(1) is replaced by the process chamber 202a(1), a substrate loading/unloading gate 148a(1) is provided in the sidewall facing toward the process chamber 202a(1).

Similarly, if the process chamber 202c(1) is replaced by the process chamber 202a(2), a substrate loading/unloading gate 148a(2) is provided in the sidewall facing toward the process chamber 20242).

If the process chamber 20241) is replaced by the process chamber 202b(1), a substrate loading/unloading, gate 148b(1) is provided in the sidewall facing toward the process chamber 202b(1).

If the process chamber 202c(1) is replaced by the process chamber 202b(2), a substrate loading/unloading gate 148b(2) is provided in the sidewall facing toward the process chamber 202b(2).

If the process chamber 202c(1) is replaced by the process chamber 202c(2), a substrate loading/unloading gate 148b(2) is provided in the sidewall facing toward the process chamber 202c(2).

If the process chamber 202c(1) is replaced by the process chamber 202d(1), a substrate loading/unloading gate 148d(1) is provided in the sidewall facing toward the process chamber 202d(1).

If the process chamber 202c(1) is replaced by the process chamber 202d(2), a substrate loading/unloading gate 148d(2) is provided in the sidewall facing toward the process chamber 202d(2).

As illustrated in FIG. 1, gate valves 149 are installed in the respective process chambers 202. Specifically, a gate valve 149a(1) is installed in the process chamber 202a(1) and a gate valve 149a(2) is installed in the process chamber 202a(2). Agate valve 149b(1) is installed in the process chamber 202b(1) and a gate valve 149b(2) is installed in the process chamber 202b(2). A gate valve 149c(1) is installed in the process chamber 202c(1) and a gate valve 149c(2) is installed in the process chamber 202c(2). A gate valve 149d(1) is installed in the process chamber 202d(1) and a gate valve 149d(2) is installed in the process chamber 202d(2).

By opening and closing the respective gate valves 149, it is possible to load and unload the wafers 200 through the substrate loading/unloading gates 148.

Furthermore, a temperature sensor 164 is installed in the housing 141. The temperature sensor 164 is configured to detect the temperature of the arm 180 of the robot 170, particularly the temperature of a first link structure 183, a shaft 184, or end effectors 181 and 182, which will be described in detail below. A temperature monitoring part 165 is connected to the temperature sensor 164. The temperature monitoring part 165 is electrically connected to the controller 280 and is configured to transmit the detected temperature information to the controller 280.

Figure 3:
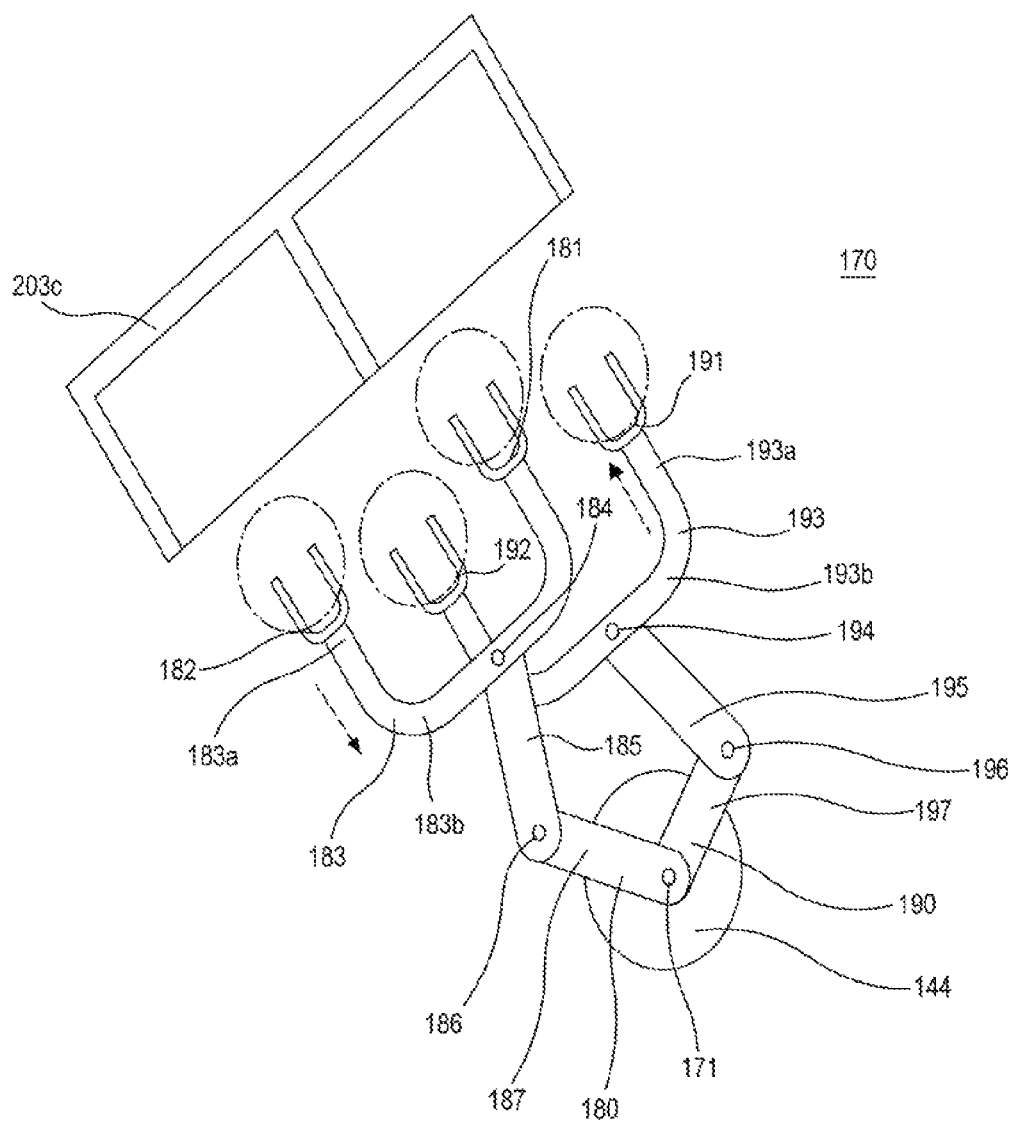
FIG. 3 is an explanatory view illustrating a configuration of a robot according to an embodiment of the present disclosure.
Figure 4:
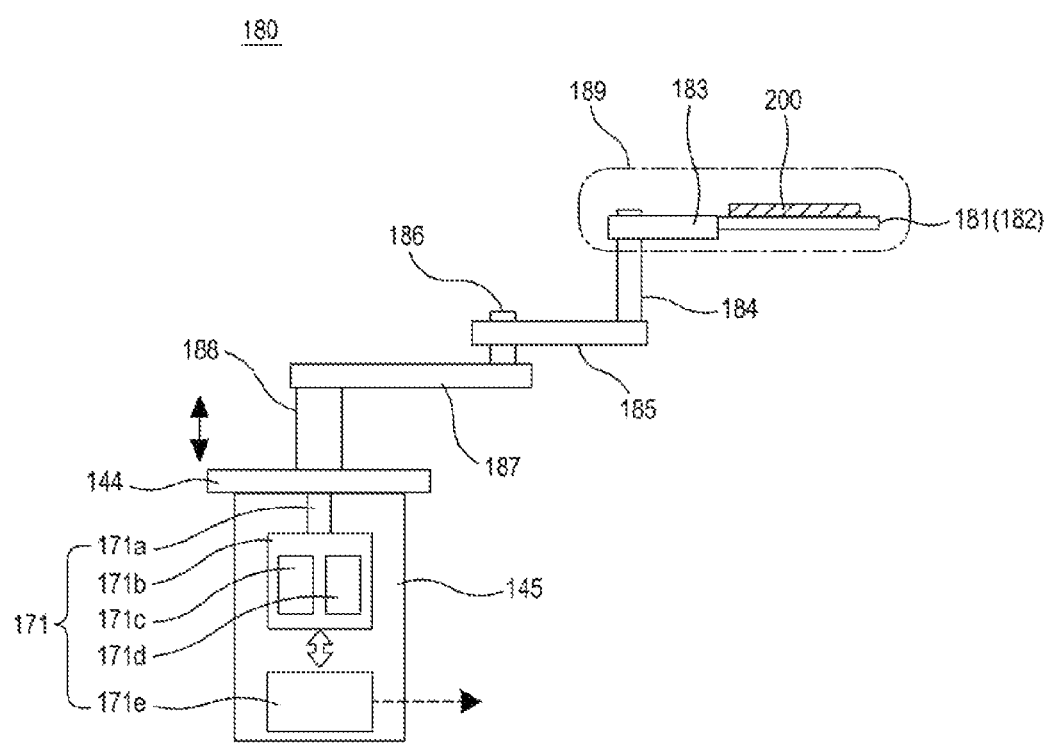
FIG. 4 is an explanatory view illustrating a configuration of a robot according to an embodiment of the present disclosure.
Figure 5:
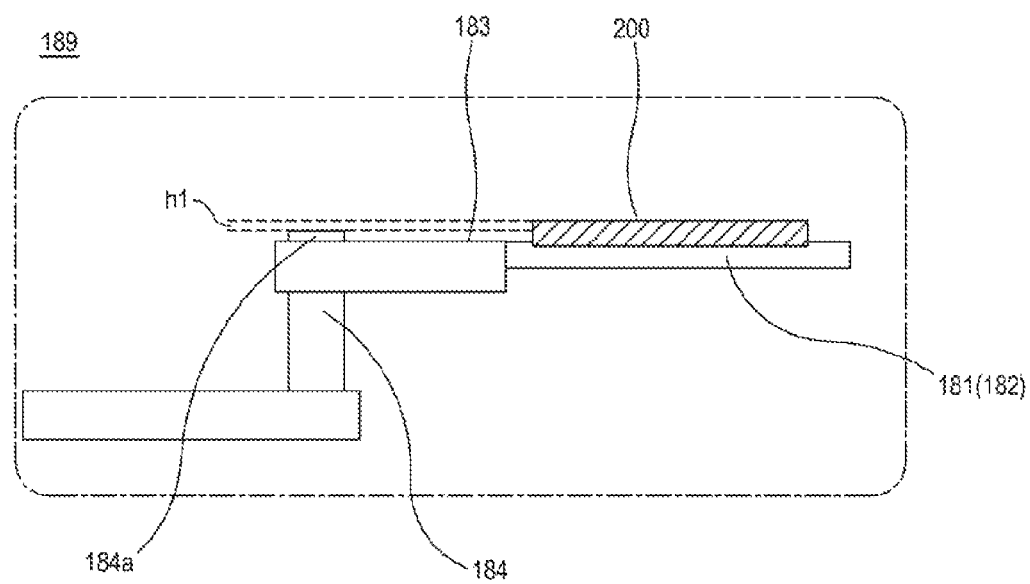
FIG. 5 is an explanatory view illustrating a configuration of a robot according to an embodiment of the present disclosure.
Figure 6:
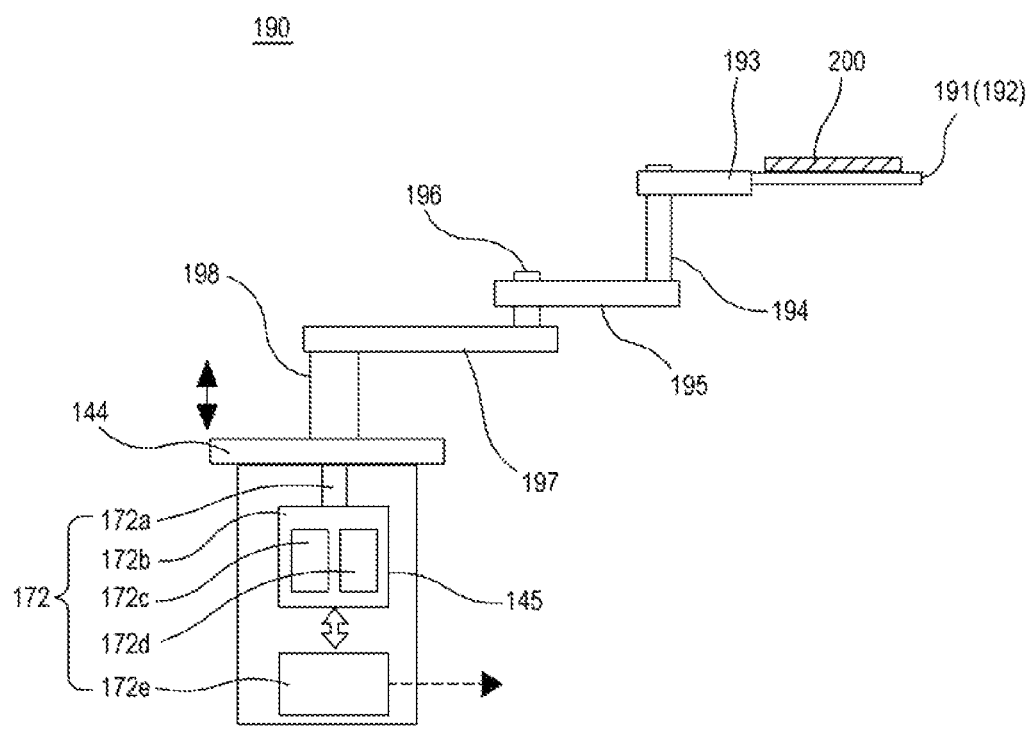
FIG. 6 is an explanatory view illustrating a configuration of a robot according to an embodiment of the present disclosure.

Subsequently, the robot 170 installed in the vacuum transfer chamber 140 will be described with respect to FIGS. 3 to 6. FIG. 3 is an enlarged view of the robot 170 illustrated in FIG. 1. FIG. 4 is a side view of the arm 180 of the robot 170 illustrated in FIG. 2. FIG. 5 is an enlarged view of a portion 189 including an end effector and a first link structure 183 illustrated in FIG. 4. FIG. 6 is a side view of the arm 190 of the robot 170 illustrated in FIG. 2. The arm 180 and the arm 190 are installed adjacent to each other. However, for the sake of convenience in description, the arm 190 is omitted in FIG. 4 and the arm 180 is omitted in FIG. 6.

The robot 170 includes two arms 180 and 190.

The arm 180 as a first arm mainly includes an end effector 181, an end effector 182, a first link structure 183, a second link structure 185, a third link structure 187, and shafts for connecting them.

The first link structure 183, which is referred to as a fork portion, includes a plurality of fixing portions 183*a* configured to fix the end effector 181 and the end effector 182, respectively, and a support portion 183*b* configured to support the fixing portions 183*a*. A shaft hole as a first hole is formed in the support portion 183*b*. A shaft 184 is inserted into the shaft hole. When fixing the end effector 181 and the end effector 182, they are fixed so that the front ends thereof are oriented in the same direction.

Processed wafers 200, which have been processed in the process chambers 202, are mounted on the end effector 181 and the end effector 182.

Shaft holes are formed in the both of the end portions of the second link structure 185. The shaft 184 is inserted into the shaft hole of one end portion, which is a second hole. A shaft 186 is inserted into the shaft hole of the other end portion, which is a third hole. Shaft holes are formed in the both of the end portions of the third link structure 187. The shaft 186 is inserted into the shaft hole of one end portion. The other end portion of the third link structure 187 is fixed to a shaft 188. The shaft 188 is rotatably fitted to the flange 144.

Figure 15:
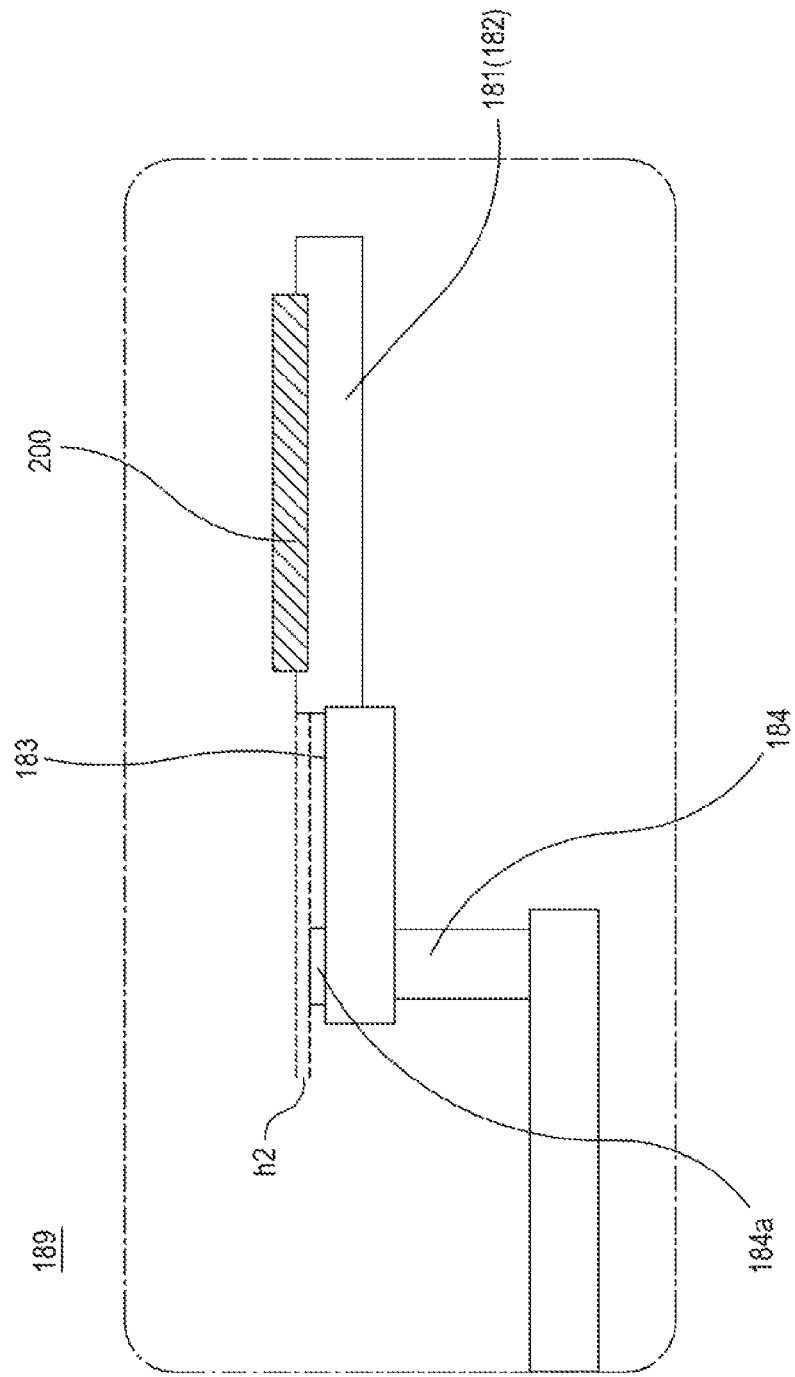
FIG. 15 is an explanatory view illustrating a configuration of a robot according to an embodiment of the present disclosure.

As illustrated in FIG. 5, the front end 184*a* of the shaft 184 penetrates the first link structure 183. The front end 184*a* of the shaft 184 protrudes in order to secure the mechanical strength for supporting the first link structure 183. The height of the front end 184*a* of the shaft 184 may be lower by h1 than the height of the wafers 200 mounted on the end effectors 181 and 182 or may be equal to the height of the wafers 200 mounted on the end effectors 181 and 182. In the case where the height of the upper end portions of the end effectors 181 and 182 is higher than the height of the front end 184*a* as illustrated in FIG. 15, the height of the front end 184*a* may be lower by h2 than the height of the upper end portion of the end effectors 181 and 182 or may be equal to the height of the upper end portion of the end effectors 181 and 182. By doing so, it is possible to bring the end effector 181 and the first link structure 183 close to the cooling plate 143 with no interference of the front end 184*a*. Accordingly, it is possible to increase the cooling efficiency of the end effectors 181 and 182 and the first link structure 183. While the end effector 182 has been described herein, the descriptions also apply to the end effector 181.

An arm control part 171 which controls the up/down movement and rotation of the arm 180 is installed within the elevator 145. The arm control part 171 mainly includes a support shaft 171*a* configured to support the shaft 188 and an actuator part 171*b* configured to vertically move or rotate the support shaft 171*a*. A hole is formed in the portion of the flange 144 existing between the shaft 188 and the support shaft 171*a*. The support shaft 171*a* is configured to directly support the shaft 188. The actuator part 171*b* includes, for example, an elevator mechanism 171*c* including a motor for the realization of up/down movement, and a rotary mechanism 171*d*, such as gears or the like, for rotating the support shaft 171*a*. Within the elevator 145, an instruction part 171*e* for instructing up/down movement and rotation of the actuator part 171*b* may be installed as a portion of the arm control part 171. The instruction part 171*e* is electrically connected to the controller 280. The instruction part 171*e* controls the actuator part 171*b* based on the instruction of the controller 280.

The arm 190 as a second arm mainly includes an end effector 191, an end effector 192, a first link structure 193, a second link structure 195, a third link structure 197, and shafts for connecting them.

The first link structure 193, which is referred to as a fork portion, includes a plurality of fixing portions 193*a* configured to fix the end effector 191 and the end effector 192, respectively, and a support portion 193*b* configured to support the fixing portions 193*a*. A shaft hole as is formed in the support portion 193*b*. A shaft 194 is inserted into the shaft hole. When fixing the end effector 191 and the end effector 192, they are fixed so that the front ends thereof are oriented in the same direction.

Unprocessed wafers 200 unloaded from the load lock chamber 130 are mounted on the end effector 191 and the end effector 192.

Shaft holes are formed in both of the end portions of the second link structure 195. A shaft 194 is inserted into the shaft hole of one end portion and a shaft 196 is inserted into the shaft hole of the other end portion. Shaft holes are formed in both of the end portions of the third link structure 197. The shaft 196 is inserted into the shaft hole of one end portion. The other end portion of the third link structure 197 is fixed to a shaft 198. The shaft 198 is rotatably fitted to the flange 144.

An arm control part 172 which controls the up/down movement and rotation of the arm 190 is installed within the elevator 145. The arm control part 172 mainly includes a support shaft 172*a* configured to support the shaft 198 and an actuator part 172*b* configured to vertically move or rotate the support shaft 172*a*. A hole is formed in the portion of the flange 144 existing between the shaft 198 and the support shaft 172*a*. The support shaft 172*a* is configured to directly support the shaft 198. The actuator part 172*b* includes, for example, an elevator mechanism 172*c* including a motor for the realization of up/down movement, and a rotary mechanism 1724, such as gears or the like, for rotating the support shaft 172*a*. Within the elevator 145, an instruction part 172*e* for instructing up/down movement and rotation of the actuator part 172*b* may be installed as a portion of the arm control part 172. The instruction part 172*e* is electrically connected to the controller 280. The instruction part 172*e* controls the actuator part 172*b* based on the instruction of the controller 280.

The end effector 181 and the end effector 182 are configured to be positioned higher than the end effector 191 and the end effector 192.

The arm 180 and the arm 190 are capable of rotating about a shaft and capable of being extended. By performing rotation and extension, the arm 180 and the arm 190 carries the wafers 200 into the process chambers 202 and carries the wafers 200 out of the process chambers 202.

(Module)

Subsequently, the module 201 will be described with reference to FIGS. 1, 2 and 7.

Figure 7:
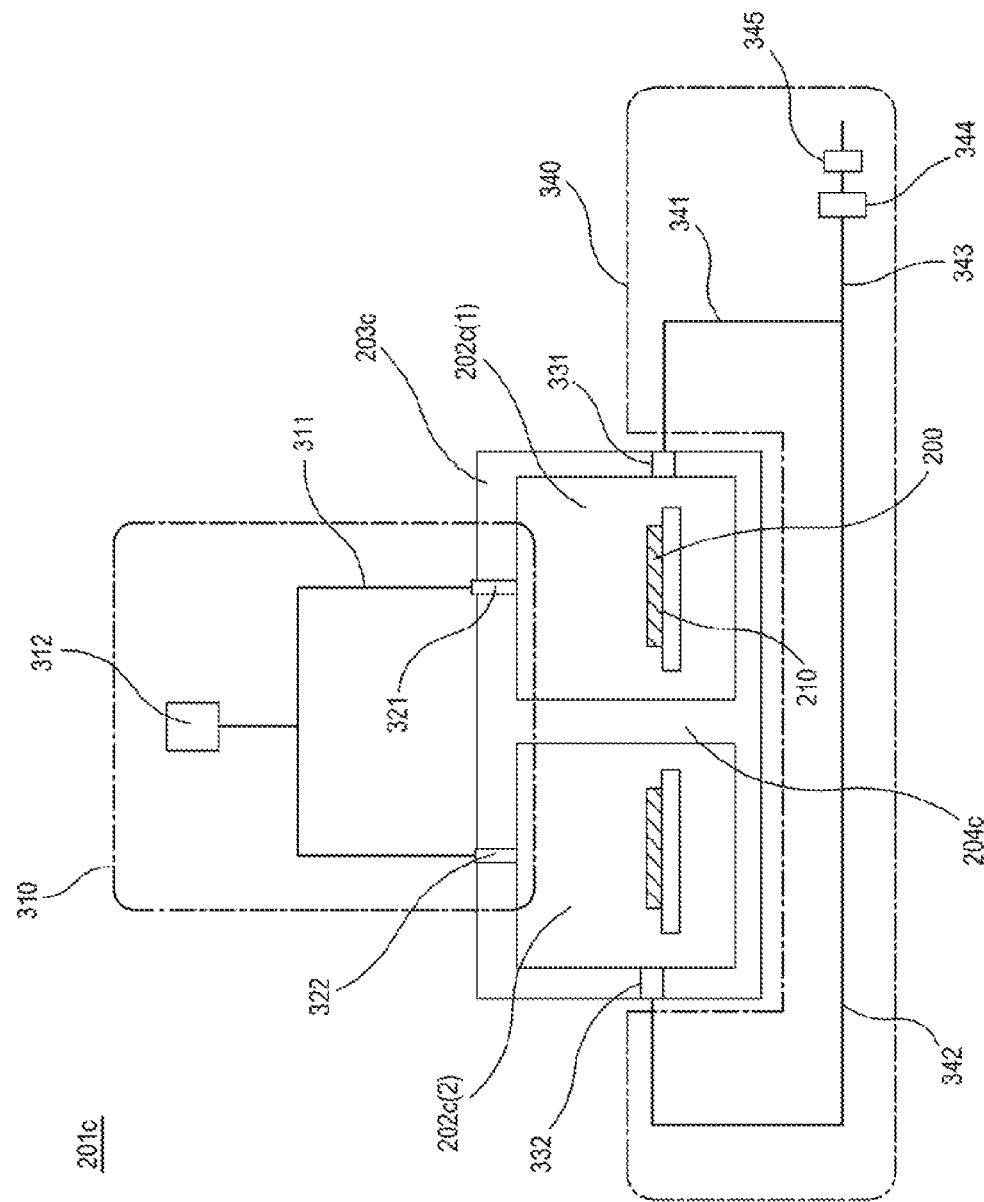
FIG. 7 is an explanatory view illustrating a module according to an embodiment of the present disclosure and a peripheral structure thereof.

FIG. 7 is a sectional view taken along line β-β' in FIG. 1 and is an explanatory view illustrating the relationship between the gas supply part and the gas exhaust part in the module 201 and the module 201.

The module 201 is formed of a housing 203. Specifically, the module 201*a* is formed of a housing 203*a*, the module 201*b* is formed of a housing 203*b*, the module 201*c* is formed of a housing 203*c*, and the module 201*d* is formed of a housing 203*d*.

A substrate loading/unloading gate 148*a*(1) is provided in one of the walls defining the process chamber 202*a*(1) in which the process chamber 202*a*(1) adjoins the vacuum transfer chamber 140. In other modules, similarly, a substrate loading/unloading gate 148a(2) is provided in the wall in which the process chamber 202a(2) adjoins the vacuum transfer chamber 140. A substrate loading/unloading gate 148b(1) is provided in the wall in which the process chamber 202b(1) adjoins the vacuum transfer chamber 140. A substrate loading/unloading gate 148b(2) is provided in the wall in which the process chamber 202b(2) adjoins the vacuum transfer chamber 140. A substrate loading/unloading gate 148c(1) is provided in the wall in which the process chamber 202c(1) adjoins the vacuum transfer chamber 140. A substrate loading/unloading gate 148c(2) is provided in the wall in which the process chamber 202c(2) adjoins the vacuum transfer chamber 140. A substrate loading/unloading gate 148d(1) is provided in the wall in which the process chamber 202d(1) adjoins the vacuum transfer chamber 140. A substrate loading/unloading gate 148d(2) is provided in the wall in which the process chamber 202d(2) adjoins the vacuum transfer chamber 140.

Hereinafter, the overall structure of the module will be described by taking the module 201c as an example. Other modules 201a, 201b, and 201d have the same structure. Thus, the descriptions thereof will be omitted herein.

As illustrated in FIG. 7, the process chamber 202c(1) and the process chamber 202c(2) for processing the wafers 200 are installed in the housing 203c. A partition wall 204c is installed between the process chamber 202c(1) and the process chamber 202c(2). By doing so, the internal atmosphere of the process chamber 202c(1) and the internal atmosphere of the process chamber 202c(2) are isolated from each other.

A substrate support part 210 which supports the wafer 200 is installed within each of the process chambers 202.

A gas supply part 310 which supplies a process gas to the process chamber 202c(1) and the process chamber 202c(2) is installed in the module 201c. The gas supply part 310 is provided with a gas supply pipe 311. As will be described later, a gas supply source, a mass flow controller, and a valve are installed in the gas supply pipe 311 in the named order from the upstream side. In FIG. 7, the gas supply pipe, the mass flow controller, and the valve are collectively referred to as a gas supply structure 312.

The gas supply pipe 311 is divided into two branches at the downstream side of the gas supply structure 312 The ends of the respective branches are connected to a gas supply hole 371 of the process chamber 202c(1) and a gas supply hole 322 of the process chamber 202c(2).

In the module 201c, there is installed a gas exhaust part 340 which exhausts a gas from the process chamber 202c(1) and the process chamber 202c(2). Exhaust pipes constituting the gas exhaust part 340 includes an exhaust pipe 341 installed in an exhaust hole 331 of the process chamber 202c(1), an exhaust pipe 342 installed in an exhaust hole 332 of the process chamber 202c(2), and a junction pipe 343 in which the exhaust pipe 341 and the exhaust pipe 342 merge with each other. A pressure regulator 344 and a pump 345 are installed in the junction pipe 343 in the named order from the upstream side to regulate the internal pressure of the respective process chambers in cooperation with the gas supply part 310.

(Process Chamber)

Subsequently, the process chamber 202 and the peripheral structure thereof will be described with reference to FIG. 8. As illustrated in FIGS. 1 and 7, another adjoining process chamber is disposed adjacent to the process chamber 202. For the sake of convenience in descriptions, the adjoining process chamber is omitted herein.

Figure 8:
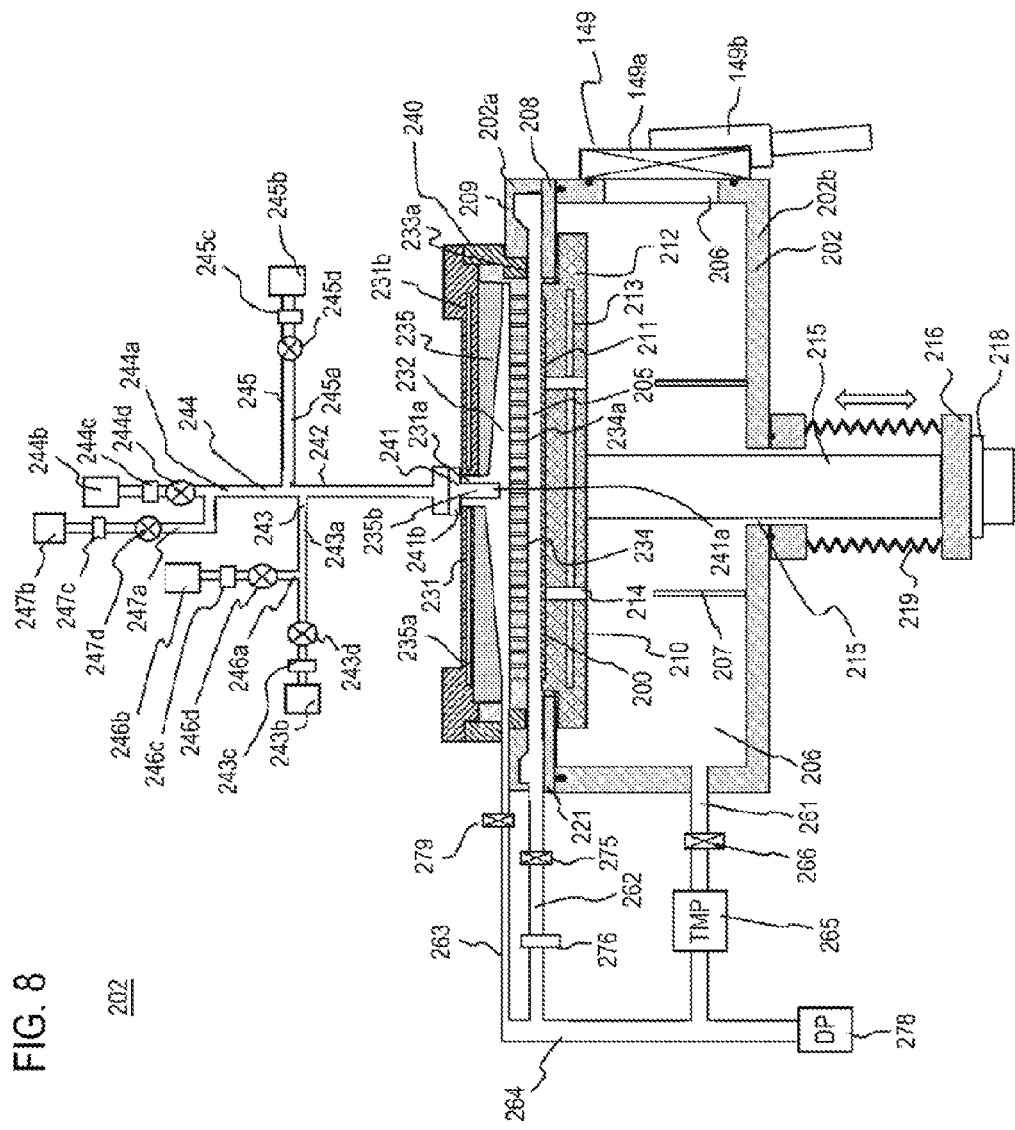
FIG. 8 is a view illustrating a process chamber according to an embodiment of the present disclosure and a peripheral structure thereof.

The module 201 includes a process chamber 202 illustrated in FIG. 8. The process chamber 202 is configured as a flat sealed vessel having a circular horizontal cross-section. Furthermore, the process chamber 202 is made of a metallic material such as e.g., aluminum (Al) or stainless steel (SUS). Within the process chamber 202, there are formed a processing space 205 in which the wafer 200 such as a silicon wafer or the like as a substrate is processed and a transfer space 206 through which the wafer 200 passes when transferring the wafer 200 to the processing space 205. The process chamber 202 is configured by an upper vessel 202a and a lower vessel 202b. A partition plate 208 is installed between the upper vessel 202a and the lower vessel 202b.

A substrate loading/unloading gate 148 adjoining the gate valve 149 is provided on the side surface of the lower vessel 202b. The wafer 200 is moved toward and from a transfer chamber (not illustrated) through the substrate loading/unloading gate 148. A plurality of lift pins 207 is installed in the bottom portion of the lower vessel 202b. Furthermore, the lower vessel 202b is grounded.

The gate valve 149 includes a valve body 149a and a driving body 149b. The valve body 149a is fixed to a portion of the driving body 149b. When opening the gate valve 149, the driving body 149b is operated to move away from the process chamber 202, thereby moving the valve body 149a away from the process chamber 202. When closing the gate valve 149, the driving body 149b is moved toward the process chamber 202, thereby pressing the valve body 149a against the sidewall of the process chamber 202 and closing the gate valve 149.

A substrate support part 210 which supports the wafer 200 is installed within the processing space 205. The substrate support part 210 mainly includes a substrate mounting surface 211 configured to mount the wafer 200 thereon, a substrate mounting table 212 having the substrate mounting surface 211 on its front surface, and a heater 213 as a heat source embedded in the substrate mounting table 212. In the substrate mounting table 212 through-holes 214 through which the lift pins 207 pass are formed in the positions corresponding to the lift pins 207.

The substrate mounting table 212 is supported by a shaft 217. A support portion of the shaft 217 is inserted through a hole 215 formed in the bottom wall of the process chamber 202 and is connected to an elevator mechanism 218 via a support plate 216 outside the process chamber 202. By operating the elevator mechanism 218 and moving the shaft 217 and the substrate mounting table 212 up and down, it is possible to vertically move the wafer 200 mounted on the substrate mounting surface 211. Furthermore, the periphery of the lower end portion of the shaft 217 is covered with a bellows 219. The interior of the process chamber is kept air-tight.

When transferring the wafer 200, the substrate mounting table 212 is moved down to a position where the substrate mounting surface 211 is aligned with the substrate loading/unloading gate 148. When processing the wafer 200, as illustrated in FIG. 8, the substrate mounting table 212 is moved up until the wafer 200 reaches a processing position within the processing space 205.

Specifically, when the substrate mounting table 212 is moved down to a wafer transfer position, the upper end portions of the lift pins 207 protrudes from the upper surface of the substrate mounting surface 211 so that the lift pins 207 supports the wafer 200 from below. Furthermore, when the substrate mounting table 212 is moved up to a wafer processing position, the lift pins 207 are retracted from the upper surface of the substrate mounting surface 211 so that the substrate mounting surface 211 supports the wafer 200 from below. Since the lift pins 207 make direct contact with the wafer 200, the lift pins 207 may be made of a material such as, e.g., quartz or alumina.

A shower head 230 as a gas distribution mechanism is installed above (at the upstream side of) the processing space 205. A through-hole 231a into which a first distribution mechanism 241 is inserted is formed in a cover 231 of the shower head 230. The first distribution mechanism 241 includes a front end portion 241a inserted into the shower head 230 and a flange 241b fixed to the cover 231.

The front end portion 241a is formed in a columnar shape, for example, a cylindrical columnar shape. Distribution holes are formed on the side surface of the front end portion 241a. A gas supplied from a gas supply part (supply system) of a process chamber, which will be described in detail below, is supplied into a buffer space 232 via the front end portion 241a.

The shower head 230 includes a distribution plate 234 as a second distribution mechanism for distributing a gas. The buffer space 232 exists at the upstream side of the distribution plate 234. The processing space 205 exists at the downstream side of the distribution plate 234. A plurality of through-holes 234a is formed in the distribution plate 234. The distribution plate 234 is disposed so as to oppose to the substrate mounting surface 211.

A shower head heating part 231b configured to heat the shower head 230 is installed in the cover 231. The shower head heating part 231b heats the shower head 230 to a temperature at which the gas supplied into the buffer space 232 is not re-liquefied. For example, the shower head heating part 231b is controlled so as to heat the shower head 230 to about 100 degrees C.

The distribution plate 234 is formed in, for example, a disc shape. The through-holes 234a are formed over the entire surface of the distribution plate 234. The through-holes 234a adjoining each other are disposed at, for example, an equal distance. The through-holes 234a existing at the outermost periphery are disposed more outward than the periphery of the wafer 200 mounted on the substrate mounting table 212.

Furthermore, the shower head 230 includes a gas guide 235 which guides the gas supplied from the first distribution mechanism 241 to the distribution plate 234. The gas guide 235 is shaped such that the diameter thereof grows larger toward the distribution plate 234. The inner surface of the gas guide 235 is formed in a cone shape (e.g., a conical shape which is also called a pyramidal shape). The gas guide 235 is formed such that the lower end portion thereof is positioned more outward than the through-holes 234a formed at the outermost periphery of the distribution plate 234.

The upper vessel 202a includes a flange. A support block 233 is mounted on and fixed to the flange. The support block 233 includes a flange 233a. The distribution plate 234 is mounted on and fixed to the flange 233a. Furthermore, the cover 231 is fixed to the upper surface of the support block 233. By employing this structure, it is possible to sequentially remove the cover 231, the distribution plate 234, and the support block 233 from above.

(Supply Part)

A supply part of the process chamber 202 described herein has the same configuration as the gas supply part 310 illustrated in FIG. 7. A configuration of the supply part corresponding to one process chamber will be described in detail.

The first distribution mechanism 241 serving as a process chamber-side gas supply pipe is connected to a gas introduction hole 231a (corresponding to the gas introduction hole 321 or 322 illustrated in FIG. 7) formed in the cover 231 of the shower head 230. A common gas supply pipe 242 is connected to the first distribution mechanism 241. The first distribution mechanism 241 and the common gas supply pipe 242 correspond to the gas supply pipe 311 illustrated in FIG. 7.

The first distribution mechanism 241 is provided with a flange which is fixed to the cover 231 and the flange of the common gas supply pipe 242 by screws or the like.

The first distribution mechanism 241 and the common gas supply pipe 242 communicate with each other in the interior thereof. The gas supplied from the common gas supply pipe 242 is supplied into the shower head 230 via the first distribution mechanism 241 and the gas introduction hole 231a.

A first gas supply pipe 243a, a second gas supply pipe 244a, and a third gas supply pipe 245a are connected to the common gas supply pipe 242. The second gas supply pipe 244a is connected to the common gas supply pipe 242.

A first-element-containing gas is mainly supplied from a first gas supply system 243 including the first gas supply pipe 243a. A second-element-containing gas is mainly supplied from a second gas supply system 244 including the second gas supply pipe 244a.

(First Gas Supply System of Process Chamber)

A first gas supply source 243b, a mass flow controller (MFC) 243c, which is a flow rate controller (flow rate control part), and a valve 243d, which is an opening/closing valve, are installed in the first gas supply pipe 243a in the named order from the upstream side.

From the first gas supply pipe 243a, a gas containing a first element (hereinafter referred to as a "first-element-containing gas") is supplied to the shower head 230 via the mass flow controller 243c, the valve 243d and the common gas supply pipe 242.

The first-element-containing as is a precursor gas, namely one of process gases. The first element referred to herein is, for example, silicon (Si). That is, the first-element-containing gas is, for example, a silicon-containing gas. Specifically, a dichlorosilane ($SiH_2Cl_2$, also referred to as DCS) gas is used as the silicon-containing gas.

Furthermore, the first-element-containing gas may be any one of a solid, a liquid and a gas under the room temperature and the atmospheric pressure. In the case where the first-element-containing gas is a liquid under the room temperature and the atmospheric pressure, a vaporizer (not illustrated) may be installed between the first gas supply source 243b and the mass flow controller 243c. In the present embodiment, the first-element-containing gas will be described as being a gas.

A downstream end of a first inert gas supply pipe 246a is connected to the first gas supply pipe 243a at the downstream side of the valve 243d. A first inert gas supply source 246b, a mass flow controller (MFC) 246c, which is a flow rate controller (flow rate control part), and a valve 246d, which is an opening/closing valve, are installed in the first inert gas supply pipe 246a in the named order from the upstream side.

In this regard, the inert gas is, for example, a nitrogen ($N_2$) gas. As the inert gas, in addition to the $N_2$ gas, it may be possible to use a rare gas such as, e.g., a helium (He) gas, a neon (Ne) gas or an argon (Ar) gas.

A first-element-containing gas supply system 243 (also referred to as a silicon containing gas supply system) is mainly configured by the first gas supply pipe 243a, the mass flow controller 243c and the valve 243d.

Furthermore, a first inert gas supply system is mainly configured by the first inert gas supply pipe 246a, the mass flow controller 246c, and the valve 246d. The inert gas supply source 246b and the first gas supply pipe 243a may be included in the first inert gas supply system.

Moreover, the first gas supply source 243b and the first inert gas supply system may be included in the first-element-containing gas supply system 243.

(Second Gas Supply System of Process Chamber)

A second gas supply source 244b, a mass flow controller (MFC) 244c, which is a flow rate controller (flow rate control part), and a valve 244d, which is an opening/closing valve, are installed in the second gas supply pipe 244a in the named order from the upstream side.

From the second gas supply pipe 244a, a gas containing a second element (hereinafter referred to as a "second-element-containing gas") is supplied into the shower head 230 via the mass flow controller 244c, the valve 244d, and the common gas supply pipe 242.

The second-element-containing gas is one of process gases. Furthermore, the second-element-containing gas may be regarded as a reaction gas or a modifying gas.

In this regard, the second-element-containing gas contains a second element differing from the first element. The second element is, for example, one of oxygen (O), nitrogen (N) and carbon (C). In the present embodiment, the second-element-containing gas is assumed to be, for example, a nitrogen-containing gas. Specifically, an ammonia ($NH_3$) gas is used as the nitrogen-containing gas.

A second-element-containing gas supply system 244 (also referred to as a nitrogen containing gas supply system) is mainly configured by the second gas supply pipe 244a, the mass flow controller 244c, and the valve 244d.

Furthermore, a downstream end of a second inert gas supply pipe 247a is connected to the second gas supply pipe 244a at the downstream side of the valve 244d. A second inert gas supply source 247b, a mass flow controller (MFC) 247c, which is a flow rate controller (flow rate control part), and a valve 247d, which is an opening/closing valve, are installed in the second inert gas supply pipe 247a in the named order from the upstream side.

From the second inert gas supply pipe 247a, an inert gas is supplied into the shower head 230 via the mass flow controller 247c, the valve 247d, and the second gas supply pipe 244a. The inert gas acts as a carrier gas or a dilution gas at a thin film forming step (S104).

A second inert gas supply system is mainly configured by the second inert gas supply pipe 247a, the mass flow controller 247c, and the valve 247d. The inert gas supply source 247b and the second gas supply pipe 244a may be included in the second inert gas supply system.

Moreover, the second gas supply source 247b and the second inert gas supply system may be included in the second-element-containing gas supply system 244.

(Third Gas Supply System of Process Chamber)

A third gas supply source 245b, a mass flow controller (MFC) 245c, which is a flow rate controller (flow rate control part), and a valve 245d, which is an opening/closing valve, are installed in the third gas supply pipe 245a in the named order from the upstream side.

From the third gas supply pipe 245a, an inert gas as a purge gas is supplied into the shower head 230 via the mass flow controller 245c, the valve 245d, and the common gas supply pipe 242.

In this regard, the inert gas is, for example, a nitrogen ($N_2$) gas. As the inert gas, in addition to the $N_2$ gas, it may be possible to use a rare gas such as, e.g., a helium (He) gas, a neon (Ne) gas, or an argon (Ar) gas.

A third gas supply system 245 is mainly configured by the third gas supply pipe 245a, the mass flow controller 245c, and the valve 245d.

In a substrate processing process, the inert gas is supplied from the third gas supply pipe 245a into the shower head 230 via the mass flow controller 245c, the valve 245d, and the common gas supply pipe 242.

In the substrate processing process, the inert gas supplied from the inert gas supply source 245h acts as a purge gas which purges the gas staying within the process chamber 202 and the shower head 230.

(Exhaust Part)

An exhaust part is a configuration corresponding to the exhaust part 340 illustrated in FIG. 7. The exhaust system that exhausts the atmosphere of the process chamber 202 includes a plurality of exhaust pipes connected to the process chamber 202. Specifically, the exhaust system includes an exhaust pipe (first exhaust pipe) 263 connected to the buffer space 232, an exhaust pipe (second exhaust pipe) 262 connected to the processing space 205, and an exhaust pipe (third exhaust pipe) 261 connected to the transfer space 206. An exhaust pipe (fourth exhaust pipe) 264 is connected to the downstream sides of the respective exhaust pipes 261, 262, and 263.

The exhaust pipe 261 is installed on the side surface or the bottom surface of the transfer space 206. A pump 265 (turbo molecular pump (TRW)) is installed in the exhaust pipe 261. A valve 266 as a first exhaust valve for the transfer space is installed in the exhaust pipe 261 at the upstream side of the pump 265.

The exhaust pipe 262 is installed at the lateral side of the processing space 205. An auto pressure controller (APC) 276, which is a pressure controller for controlling the internal pressure of the processing space 205 to a predetermined pressure, is installed in the exhaust pipe 262. The APC 276 includes a valve body (not illustrated) whose opening degree can be adjusted. The APC 276 adjusts the conductance of the exhaust pipe 262 according to an instruction transmitted from a below-described controller. Furthermore, a valve 275 is installed in the exhaust pipe 262 at the upstream side of the APC 276. The exhaust pipe 262, the valve 275 and the APC 276 are collectively referred to as a process chamber exhaust part.

The exhaust pipe 263 is connected to the surface differing from the surface of the processing space 205. In the height direction, the exhaust pipe 263 is connected to a portion between the through-holes 234a and the gas guide 235. A valve 279 is installed in the exhaust pipe 263. The exhaust pipe 263 and the valve 279 are collectively referred to as a shower head exhaust pipe.

A dry pump (DP) 278 is installed in the exhaust pipe 264. As illustrated, the exhaust pipe 263, the exhaust pipe 262, and the exhaust pipe 261 are connected to the exhaust pipe 264 at the upstream side thereof. The DP 278 is installed at the downstream side of the exhaust pipe 264. The DP 278 exhausts the atmosphere of each of the buffer space 232, the processing space 205 and the transfer space 206 via each of the exhaust pipe 262, the exhaust pipe 263 and the exhaust pipe 261. When the TMP 265 is operated, the DP 278 serves as an auxiliary pump. That is, the TMP 265, which is a high-vacuum (ultra-high-vacuum) pump, has a difficulty in independently performing the exhaust to the atmospheric pressure. Therefore, the DP 278 is used as an auxiliary pump that performs the exhaust to the atmospheric pressure. For example, air valves are used as the respective valves of the exhaust system described above.

(Controller)

As illustrated in FIG. 1, the substrate processing apparatus 100 includes a controller 280 that controls the operations of the respective parts of the substrate processing apparatus 100. The controller 280 includes at least a calculation part 281, a memory part 282, a transmission/reception part 284, and a comparison part 285. The controller 280 is connected to the respective configurations described above. The controller 280 calls a program, a recipe or a table from the memory part 282 pursuant to an instruction of a host controller or a user and controls the operations of the respective configurations according to the contents of the program, the recipe or the table. As illustrated in FIG. 16, tables are, for example, comparison tables of temperature information and control parameters. The controller 280 may be configured as a dedicated computer or a general-purposed computer. For example, the controller 280 according to the present embodiment may be configured by preparing an external memory device 283 (e.g., a magnetic tape, a magnetic disc such as a flexible disc or a hard disc, an optical disc such as a compact disc (CD) or a digital versatile disc (DVD), a magneto-optical (MO) disc, or a semiconductor memory such as a universal serial bus (USB) memory (USB flash drive) or a memory card) which stores the program described above, and installing the program on the general-purpose computer using the external memory device 283. Furthermore, a means for supplying the program to the computer is not limited to the case of supplying the program through the external memory device 283. For example, the program may be supplied using a communication means such as the Internet or a dedicated line without going through the external memory device 283. Moreover, the memory part 282 or the external memory device 283 is configured as a non-transitory computer-readable recording medium. Hereinafter, these will be generally and simply referred to as a recording medium. Additionally, the term "recording medium" used herein may be intended to include the memory part 282 alone, the external memory device 283 alone, or both the memory part 282 and the external memory device 283. The transmission/reception part 284 is configured to exchange information with other configurations. For example, the transmission/reception part 284 receives a temperature from the temperature monitoring part 165. The comparison part 285 compares the information such as the table or the like read from the memory part 282 with the information received from other configurations, thereby extracting parameters for control. For example, the comparison part 285 compares the information received from the temperature monitoring part 165 with the table stored in the memory part 282, thereby extracting parameters for operating the robot 170.

Subsequently, the tables stored in the memory part 282 will be described with reference to FIG. 16. The tables exist in a plural number. Table 1 is a table showing the relationship between each of a vacuum transfer mode and a cooling mode and pressures within the heat transfer gas supply part 150 and the vacuum transfer chamber 140. For example, in the case of the vacuum transfer mode, the heat transfer gas supply part does not supply the heat transfer gas into the vacuum transfer chamber 140 and the pressure range is set in a range of α which is a transfer pressure. Furthermore, in the case of the cooling mode, the heat transfer gas supply part supplies the heat transfer gas into the vacuum transfer chamber 140 and the pressure range of the vacuum transfer chamber 140 is set at β.

Table 2 is a table showing the relationship between each of the vacuum transfer mode and the cooling mode, pressures within the heat transfer gas supply part 150 and the vacuum transfer chamber 140, and the arm position. For example, in the case of the vacuum transfer mode, the heat transfer gas supply part does not supply the heat transfer gas into the vacuum transfer chamber 140 and the pressure range is set in a range of α which is a transfer pressure. Furthermore, the arm position is maintained in a transfer position. Moreover, in the case of the cooling mode, the heat transfer gas supply part supplies the heat transfer gas into the vacuum transfer chamber 140 and the pressure range of the vacuum transfer chamber 140 is set at β.

Table 3 is a table showing the relationship between each of the vacuum transfer mode and the cooling mode and the temperature of the arm 180. For example, in the case where the temperature of the arm 180 is T1, the vacuum transfer mode is used. In the case where the temperature of the arm 180 is T2, the cooling mode is used.

Table 4 is a table showing the relationship between the number of transfer times of the wafer in the arm 180, the vacuum transfer mode and the cooling mode. For example, if the number of transfer times of the wafer is N or less, the vacuum transfer mode is used. If the number of transfer times of the wafer is greater than N, the cooling mode is used.

The calculation part 281 makes it possible to appropriately select these tables.

<Substrate Processing Process>

Next, descriptions will be made on a process of forming a thin film on the wafer 200 using the substrate processing apparatus 100. In the following descriptions, the operations of the respective parts of the substrate processing apparatus 100 are controlled by the controller 280.

(Transfer Step from Atmospheric Transfer Chamber to Load Lock Chamber)

The pod 111 that accommodates, for example, 25 unprocessed wafers 200, is transferred to the substrate processing apparatus, which performs a heating step, by an in-process transfer device. As illustrated in FIGS. 1 and 2, the pod 111 thus transferred is delivered from the in-process transfer device to the IO stage 110 and is mounted on the IO stage 110. The cap 112 of the pod 111 is removed by the pod opener 121. Thus, the substrate loading/unloading opening of the pod 111 is opened.

If the pod 111 is opened by the pod opener 121, the atmospheric transfer robot 122 installed in the atmospheric transfer chamber 120 picks up the wafer 200 from the pod 111 and loads the wafer 200 into the load lock chamber 130. Then, the atmospheric transfer robot 122 transfers the wafer 200 to the substrate mounting table 136. During the transfer work, the gate valve 134 of the load lock chamber 130 existing at the side of the vacuum transfer chamber 140 is kept closed, thereby maintaining the internal pressure of the vacuum transfer chamber 140. The internal pressure of the vacuum transfer chamber 140 is, for example, 0.1333 Pa (1 Torr), and is regulated to the pressure of the vacuum transfer mode. The vacuum transfer mode refers to a mode used when transferring the wafer 200.

If two wafers 200 are transferred to the substrate mounting surfaces 135, the gate valve 133 is closed and the interior of the load lock chamber 130 is evacuated at a negative pressure by an exhaust device (not illustrated).

(Transfer Step from Load Lock Chamber to Vacuum Transfer Chamber)

If the internal pressure of the load lock chamber 130 reaches a predetermined pressure value, the gate valve 134 is opened so that the load lock chamber 130 and the vacuum transfer chamber 140 communicate with each other. At this time, the internal pressure of the vacuum transfer chamber 140 is maintained at the pressure for the vacuum transfer mode.

Subsequently, the robot 170 loads the wafers 200 from the interior of the load lock chamber 130 into the interior of the vacuum transfer chamber 140. Specifically, two wafers 200 are picked up from the substrate mounting table 136 and are loaded into the vacuum transfer chamber 140 by the arm 190 that transfers unprocessed wafers 200, among the arms 180 and 190 of the robot 170, using the function of horizontal movement, rotational movement and up/down movement of the arm 190. At this time, the wafers 200 are mounted on the end effector 191 and the end effector 192. After the wafers 200 are loaded into the vacuum transfer chamber 140 and after the gate valve 134 is closed, for example, the gate valve 149c(1) and the gate valve 149c(2) are opened so that the vacuum transfer chamber 140 communicates with the process chamber 202c(1) and the process chamber 202c(2).

Descriptions will now be made on the operation of the robot 170 involved in the loading of the wafers 200 into the process chamber 202c(1) and the process chamber 202c(2), the substrate processing accompanied by a heating process, and the unloading of the wafer 200 from the process chamber 202c(1) and the process chamber 202c(2).

(Loading Step from Vacuum Transfer Chamber into Process Chamber)

First, the robot 170 loads the end effector 191 and the end effector 192, which carry the wafers 200, from the interior of the vacuum transfer chamber 140 into the process chamber 202c(1) and the process chamber 202c(2). Thereafter, in each of the process chambers 202, the wafer 200 is mounted on the substrate mounting surface 211 by the cooperation of the lift pins 207 and the substrate mounting table 212 existing within each of the process chambers 202.

After mounting the wafers 200, the end effector 191 and the end effector 192 of the arm 190 are retracted out of the process chambers 202. Then, the gate valve 149c(1) and the gate valve 149c(2) are closed. Thereafter, the substrate support part 210 is moved up within each of the process chambers 202 so as to reach the wafer processing position where the wafer 200 is processed.

(Temperature Increasing/Pressure Regulating Step)

Next, a temperature increasing/pressure regulating step will be described. While one process chamber is described herein as an example, the present disclosure is not limited thereto. The same processing is performed in other process chambers. The heater 213 embedded in the substrate mounting table 212 is preheated. The wafer 200 is heated by the heater 213 to a substrate processing temperature which falls within a range of, e.g., from the room temperature to 700 degrees C. The internal temperature of the process chamber 202a is maintained at a pressure falling within a range of, e.g., 0.1 Pa to 300 Pa, by the DP 278 and the IMP 265.

While the wafer 200 is heated by the heater 213 embedded in the substrate mounting table 212, there may be a case where a time is taken until the wafer 200 reaches a desired temperature. Accordingly, if one wishes to rapidly achieve a high temperature state, a lamp heating device (lamp heater) as a substrate heater, which becomes a light source for emitting infrared light, may be installed in addition to the heater 213. At the temperature increasing/pressure regulating step, if necessary, the lamp heating device is adjunctively used to heat the wafer 200 to a substrate processing temperature which exceeds 700 degrees C.

(Film Forming Step)

Next, the outline of a film forming step will be described. Details thereof will be described later. While the processing performed within one process chamber is described herein as an example, the same processing is performed in other process chambers. After the wafer 200 is heated to the substrate processing temperature, the following substrate processing accompanied by a heating process is performed while maintaining the wafer 200 at a predetermined temperature. That is, process gases for use in performing desired processing such as oxidizing, nitriding, film forming, etching and the like are supplied in a shower-like manner toward the surface (processing surface) of the wafer 200 disposed within the process chamber 202a via the common gas supply pipe 242 and the shower head 230, thereby processing the wafer 200.

(Unloading Step from Process Chamber to Vacuum Transfer Chamber)

The wafers 200 processed within the process chamber 202c(1) and the process chamber 202c(2) are unloaded by the arm 180. At this time, from the viewpoint of enhancing the throughput, the wafers 200 are transferred out of the process chamber 20241) and the process chamber 202c(2) through an operation opposite to the loading operation of the wafers 200 during the time at which the cooling of the wafers 200 is not finished, namely while maintaining the wafers 200 at a temperature relatively close to the substrate processing temperature.

Specifically, if the processing of the wafers 200 is completed, the gate valve 149c(1) and the gate valve 149c(2) are opened, in parallel, the end effectors 181 and 182 are moved to the transfer position which is equal in height to the substrate loading/unloading gate 148. Thereafter, the substrate mounting table 212 is moved down to a position for the transfer of the wafers 200. The wafers 200 are mounted on the lift pins 207. The processed wafers 200 are picked up by the end effectors 181 and 182 moved into the process chamber 202c(1) and the process chamber 202c(2). If the end effectors 181 and 182 are retracted thereafter, the wafers 200 are unloaded into the vacuum transfer chamber 140. After unloading the wafers 200, the gate valve 149c(1) and the gate valve 149c(2) are closed.

In the aforementioned manner, the respective operations, namely the loading of the wafers 200 into the process chamber 202c(1) and the process chamber 202c(2), the substrate processing accompanied by the heating process, and the unloading of the wafers 200 from the process chamber 202c(1) and the process chamber 202c(2), are completed.

The arm 180 transfers the processed wafers 200 unloaded from the process chamber 202c(1) into the load lock chamber 130. After the wafers 200 are transferred to the substrate mounting table 136 existing within the load lock chamber 130, the load lock chamber 130 is closed by the gate valve 134.

By repeating the aforementioned operations, a predetermined number of wafers 200, for example, 25 wafers 200 are sequentially processed.

(Transfer Step from Load Lock Chamber to Atmospheric Transfer Chamber)

If the gate valve 134 is closed, the interior of the load lock chamber 130 is returned to a substantially atmospheric pressure by an inert gas. If the interior of the load lock chamber 130 is returned to the substantially atmospheric pressure, the gate valve 133 is opened and the cap 112 of the empty pod 111 mounted on the IO stage 110 is opened by the pod opener 121.

Subsequently, the atmospheric transfer robot 122 picks up the wafers 200 from the substrate mounting table 136 existing within the load lock chamber 130, unloads the wafers 200 into the atmospheric transfer chamber 120 and stores the wafers 200 in the pod 111. If the storing of the wafers 200 in the pod 111 is completed, the cap 112 of the pod 111 is closed by the pod opener 121. The closed pod 111 is transferred from above the IO stage 110 to the next process by an in-process transfer device.

While the above operations have been described by taking, as an example, a case where the module 201c is used, the same operations are carried out in a case where the module 201a, the module 201b, and the module 201d are used.

Furthermore, an identical process or different processes may be performed within the module 201a, the module 201b, the module 201c, and the module 201d. In the case where different processes are performed within the module 201a, the module 201b, the module 201c, and the module 201d, for example, a certain process may be performed to the wafers 200 within the module 201c and, then, another process may be performed to the wafers 200 within the module 201d. Moreover, a certain process may be performed to the wafers 200 within the module 201a, another process may be performed to the wafers 200 within the module 201b and, then, a further process may be performed to the wafers 200 within the module 201c or the module 201d.

While the step of loading the wafers from the vacuum transfer chamber into the process chamber and the step of unloading the wafers from the process chamber into the vacuum transfer chamber have been described as different steps, the present disclosure is not limited thereto. These steps may be performed in parallel. In this case, the gate valve 149 is first opened. Thereafter, the end effectors 181 and 182 unload processed wafers. Then, the end effectors 191 and 192 load unprocessed wafers. After loading the unprocessed wafers, the end effectors 191 and 192 are retracted and the gate valve 149 is closed.

In the case of processing the wafers 200 as described above, the wafers 200 unloaded from the process chambers 202 are kept in a high temperature state. Accordingly, in the arm 180 which transfers the processed wafers 200, the heat of the wafers 200 is transferred to the end effectors 181 and 182 and the first link structure 183. Thus, the end effectors 181 and 182 and the first link structure 183 are heated. If the heat is accumulated in the end effectors 181 and 182 and the first link structure 183 by repeating the wafer transfer, a problem is posed in that the shaft 184 is broken or thermal sagging occurs in the end effectors 181 and 182 and the first link structure 183. The breakage or the thermal sagging may cause a change in the transfer height of the wafers 200. This may lead to the falling of the wafers 200 or the contact of the wafers 200 with other components, consequently reducing a yield rate.

In the case of the structure of the present embodiment in which two end effectors 181 and 182 are connected to one support portion 183b via the respective fixing portions 183a, the accumulation amount of heat becomes larger as compared with a case where a wafer is transferred by a single end effector. For that reason, the heat accumulated in the end effector 181, the end effector 182 and the fixing portions 183a is transferred to and concentrated on the support portion 183b. Therefore, for example, a problem is posed in that the support portion 183b comes into a higher temperature state as compared with a case where a single end effector is used.

Particularly, if a case of transferring a large wafer (e.g., a 450 mm wafer) is taken into account, the large wafer is larger in heat accumulation amount than a currently-used 300 mm wafer. Therefore, heat is further accumulated in the arm 180. Accordingly, in the case of transferring the large wafer, the problem of high temperature processing becomes more conspicuous.

Thus, in the present embodiment, the cooling plate 143 is installed in the ceiling of the vacuum transfer chamber 140. More preferably, a below-described cooling mode is executed to reduce the heat accumulation amount of the arm 180. Hereinafter, a specific heat reduction method using the cooling plate 143 or the cooling mode will be described.

First, at the unloading step from the process chamber to the vacuum transfer chamber, a cooling mode for cooling the arm 180 is executed prior to unloading the wafers 200 from the process chamber 202. In the cooling mode, a heat transfer gas is first supplied from the heat transfer gas supply part 150 into the housing 141. In parallel, a predetermined amount of gas is exhausted by the gas exhaust part 160 to regulate the pressure of the vacuum transfer chamber. The pressure of the vacuum transfer chamber is, for example, 1.333 to 133.3 Pa (10 to 1,000 Torr), and is set at a pressure higher than the pressure used in a vacuum transfer mode.

The above operations will be described in more detail. When performing the cooling mode, the calculation part 281 reads table 1 from the memory part 282. An operation regarding the cooling mode is recorded in table 1. The calculation part 281 extracts information on the operation regarding the cooling mode from table 1 and instructs an operation to the heat transfer gas supply 150 or the gas exhaust part 160 via the transmission/reception part 284.

Specifically, the calculation part 281 instructs the MFC 153 of the heat transfer gas supply 150 to control the supply amount of the heat transfer gas and instructs the valve 154 to be opened. The MFC 153 and the valve 154 thus instructed are operated according to the instructions. In this way, the heat transfer gas is supplied into the vacuum transfer chamber 140. Furthermore, the calculation part 281 instructs the APC 162 of the gas exhaust part 160 to set the pressure at a value falling within a range of β and instructs the valve 163 to be opened. The APC 162 and the valve 163 thus instructed are operated according to the instructions.

Within the housing 141, the density of the heat transfer gas becomes higher between the first link structure 183 and the cooling plate 143. Thus, the convention of the heat transfer gas occurs. Accordingly, the heat accumulated in the end effectors 181 and 182, the first link structure 183 and the shaft 184 moves toward the ceiling provided with the cooling plate 143. As a result, the first link structure 183 and the like are cooled.

As a result of intense research conducted by the present inventor, it was found that the heat transfer gas existing between the first link structure 183 or the like and the cooling plate 143 is affected by the heat from the housing 203 in addition to the heat of the wafers 200. For that reason, the influence of the heat of the housing 203 becomes larger as the distance between the cooling plate 143 and the first link structure 183 grows larger. Thus, the cooling efficiency becomes lower.

Accordingly, in the cooling mode, it is preferred the first link structure 183 is moved up to a standby position existing below the cooling plate 143. The standby position refers to a position higher than the transfer position where the wafers 200 are unloaded from the process chamber 202.

In this case, table 2 shown in FIG. 16 is read in place of table 1. Table 2 remains the same as table 1 in terms of the operation of the heat transfer gas supply part and the pressure-related operation and differs from table 1 in terms of the arm position. If it is determined that now is the cooling mode, the calculation part 281 instructs an operation regarding the arm position in addition to the operation of the heat transfer gas supply part and the pressure-related operation, in the present embodiment, if it is determined that now is the cooling mode, the calculation part 281 instructs the arm control part 171 so that the arm position becomes the standby position.

The above operations will be described in more detail. When performing the cooling mode, the calculation part 281 reads table 2 from the memory part 282. An operation regarding the cooling mode is recorded in table 2. The calculation part 281 extracts information on the operation regarding the cooling mode from table 2 and instructs an operation to the heat transfer gas supply 150, the gas exhaust part 160 or the arm control part 171 via the transmission/reception part 284.

Specifically, the calculation part 281 instructs the MFC 153 of the heat transfer gas supply 150 to control the supply amount of the heat transfer gas and instructs the valve 154 to be opened. The MFC 153 and the valve 154 thus instructed are operated according to the instructions. In this way, the heat transfer gas is supplied into the vacuum transfer chamber 140. Furthermore, the calculation part 281 instructs the APC 162 of the gas exhaust part 160 to set the pressure at a value falling within a range of β and instructs the valve 163 to be opened. The APC 162 and the valve 163 thus instructed are operated according to the instructions. Moreover, operation information is transmitted to the instruction part 171e. Upon receiving information that indicates a standby mode, the instruction part 171e instructs the elevator mechanism 171c of the actuator part 171b so that the end effectors 181 and 182 are positioned at a predetermined height. Based on the instructed information, the elevator mechanism 171c rotates a motor to move the end effectors 181 and 182 upward.

The standby position in the structure illustrated in FIG. 5 will now be described. The height of the front end 184a is equal to or smaller than the height of the wafers 200. Therefore, in the standby position, the front end 184a and the first link structure 183 can be disposed in a highest position, namely in a position closest to the cooling plate 143. Moreover, the end effectors 181 and 182 can also be disposed in a position close to the cooling plate 143.

If the first link structure 183 and the shaft 184 come close to the cooling plate 143 in this way, it is possible to reduce the thermal influence from the housing 203. It is therefore possible to increase the amount of heat that moves from the first link structure 183 and the shaft 184 toward the cooling plate 143. As a result, as compared with a case where the first link structure 183 and the shaft 184 do not come close to the cooling plate 143, it is possible to increase the cooling efficiency. Accordingly, it is possible to cool the shaft 184 and the first link structure 183 in a most efficient manner and to efficiently cool the end effectors 181 and 182.

The standby position in the structure illustrated in FIG. 15 will now be described. In the structure illustrated in FIG. 15, the height of the front end 184a is equal to or smaller than the height of the end effectors 181 and 182. Therefore, the end effectors 181 and 182 can be disposed in a highest position, namely in a position closest to the cooling plate 143. Moreover, the first link structure 183 and the front end 184a can also be disposed in a position close to the cooling plate 143. Accordingly, it is possible to cool the end effectors 181 and 182 in a most efficient manner and to efficiently cool the first link structure 183 and the shaft 184.

If end effectors 181 and 182 come close to the cooling plate 143 in this way, it is possible to reduce the thermal influence from the housing 203. It is therefore possible to increase the amount of heat that moves from the end effectors 181 and 182 toward the cooling plate 143. As a result, as compared with a case where the end effectors 181 and 182 do not come close to the cooling plate 143, it is possible to increase the cooling efficiency. Moreover, cooling is performed in a state in which the wafers 200 are not mounted on the end effectors 181 and 182. Therefore, as compared with a case where the wafers 200 are mounted on the end effectors 181 and 182, it is possible to more efficiently cool the end effectors 181 and 182 and the first link structure 183.

Figure 11:
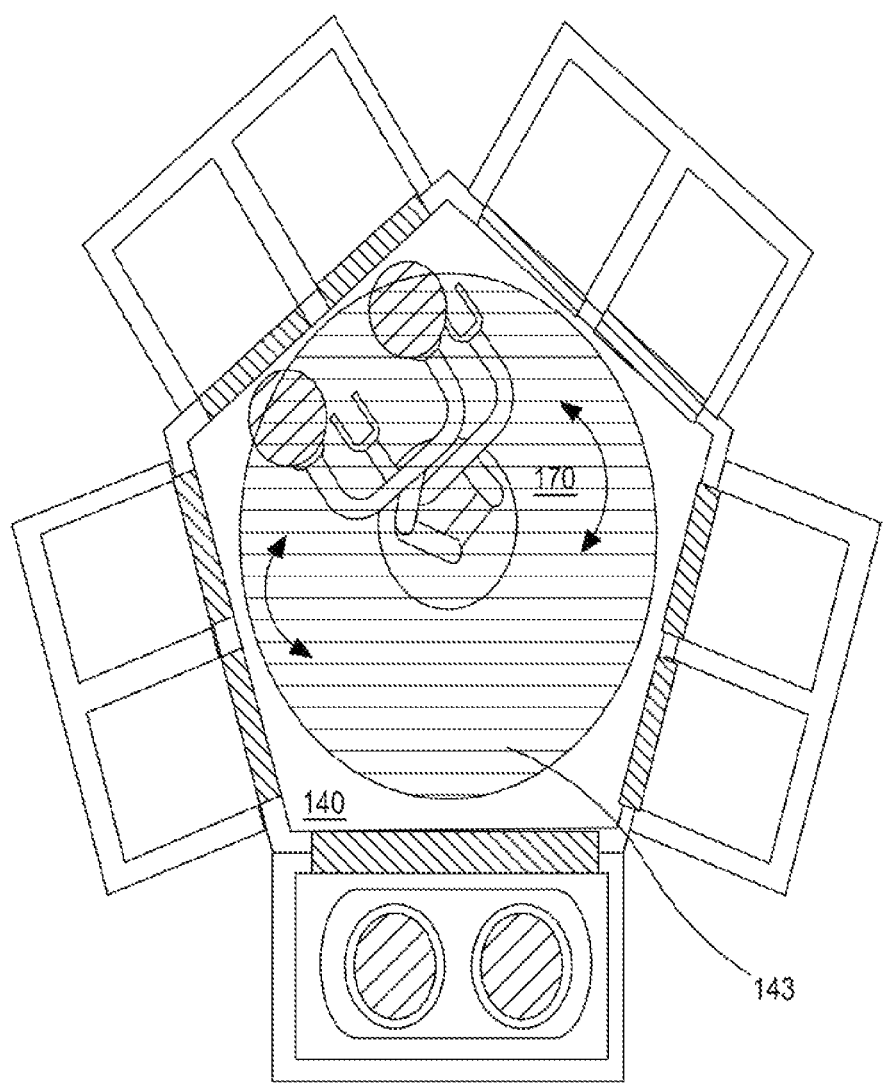
FIG. 11 is a view illustrating a cooling mechanism according to an embodiment of the present disclosure.

The horizontal relationship between the end effectors 181 and 182 and the cooling plate 143 in the standby position is as follows. As illustrated in FIG. 11, the cooling plate 143 is installed over the operation range of the end effectors 181 and 182 in the horizontal direction. In this case, it is possible to cool the end effectors 181 and 182, the first link structure 183 and the respective shafts as targets and to appropriately select the standby position. For example, in the cooling mode used when unloading the wafers from the module 201c, it is possible to select the cooling performed in a region existing below the cooling plate 143 and opposing to the gate valve 149c. This makes it possible to proceed to a next wafer unloading operation within a short period of time. Furthermore, in the cooling mode used when unloading the wafers from the module 201b, it is possible to select the cooling performed in a region existing below the cooling plate 143 and opposing to the gate valve 149b. This makes it possible to proceed to a next wafer unloading operation within a short period of time. By suitably selecting the cooling in this way, it is possible to improve the efficiency of robot management.

Figure 12:
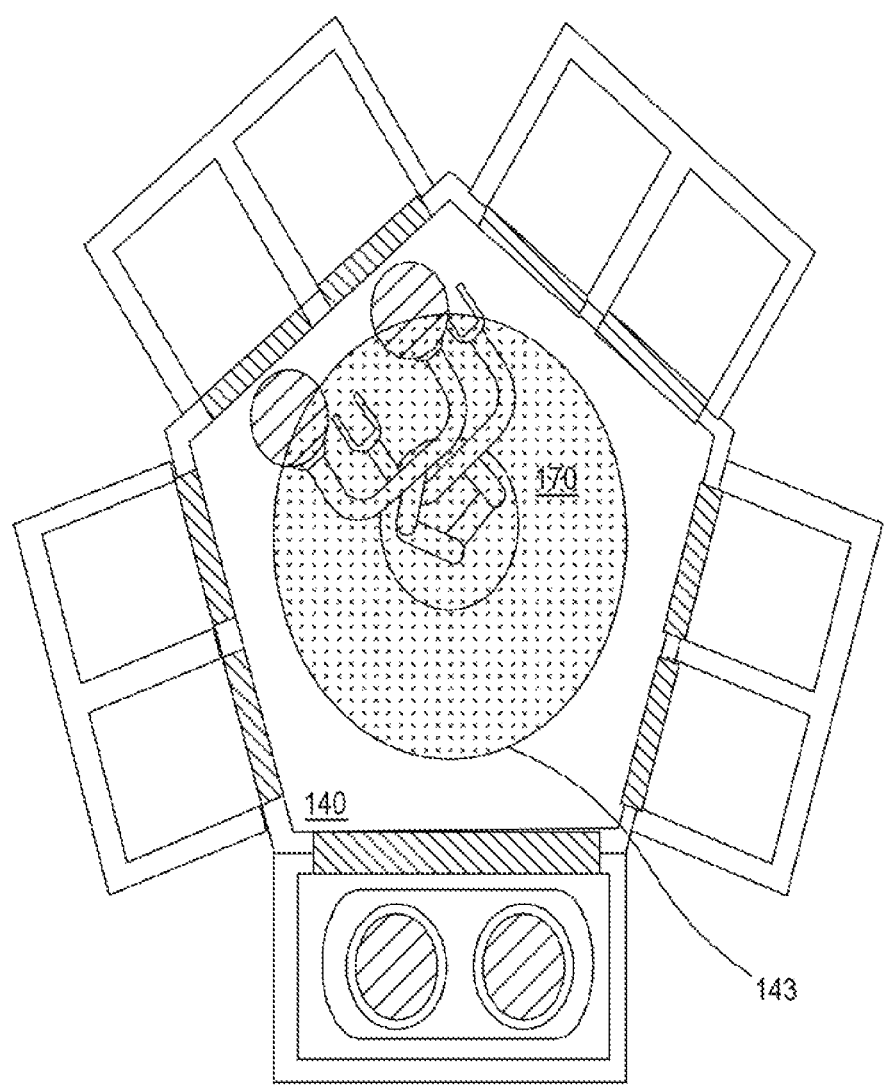
FIG. 12 is a view illustrating a cooling mechanism according to an embodiment of the present disclosure.

As illustrated in FIG. 12, the cooling plate 143 may be installed over the operation range of the first link structure 183 in the horizontal direction. By doing so, it is possible to cool the first link structure 183, in which heat is most likely to be accumulated, and to provide a gap on the cover. It is therefore possible to flexibly dispose the temperature sensor 164, the heat transfer gas supply part 150 and the like.

Figure 13:
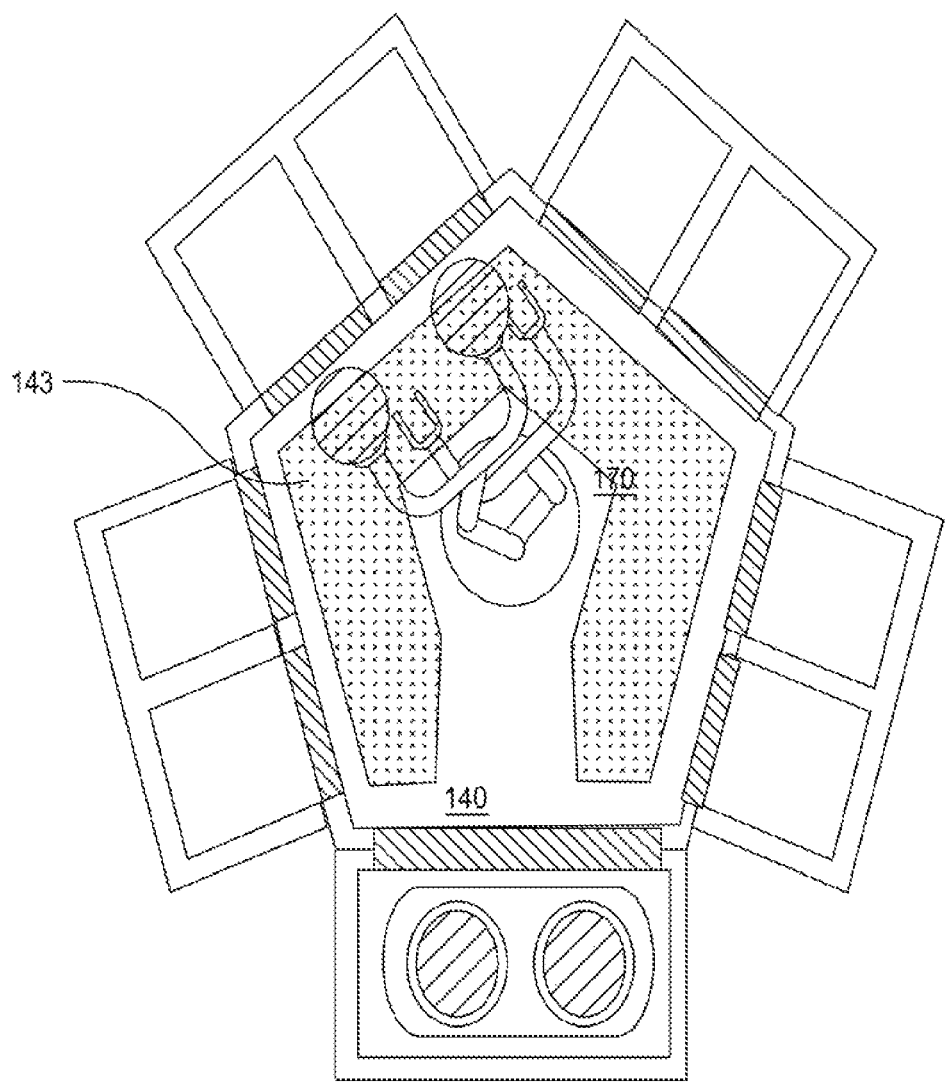
FIG. 13 is a view illustrating a cooling mechanism according to an embodiment of the present disclosure.

As illustrated in FIG. 13, the cooling plate 143 may be installed between the shaft of the robot and the substrate loading/unloading gates of the process chambers in the horizontal direction. In this case, the cooling plate 143 is installed between all the modules and the shaft of the robot. By employing this configuration, it is possible to cool the first link structure 183, in which heat is most likely to be accumulated, without increasing the footprint of the cooling plate 143. By doing so, it is possible to provide a gap on the cover. Therefore, as compared with the structure illustrated in FIG. 12, it is possible to more flexibly dispose the temperature sensor 164, the heat transfer gas supply part 150 and the like.

Figure 14:
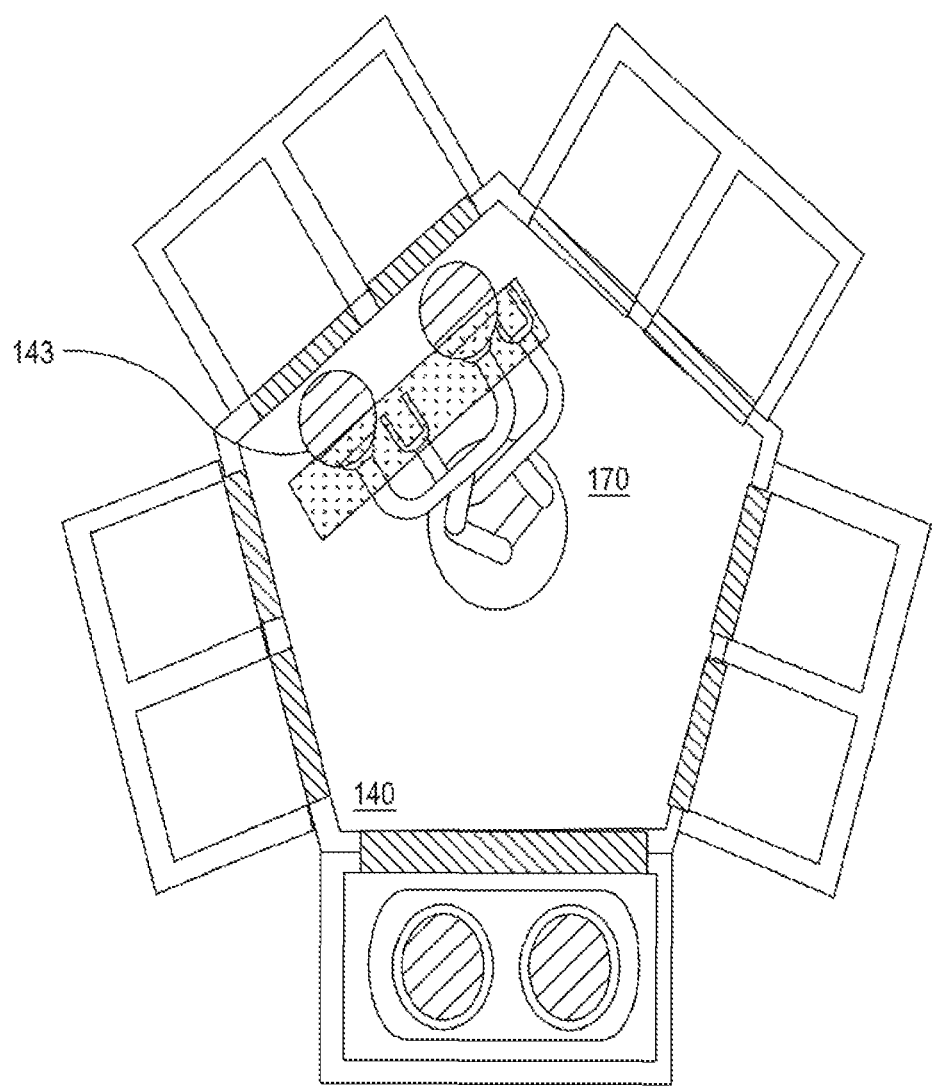
FIG. 14 is a view illustrating a cooling mechanism according to an embodiment of the present disclosure.

As illustrated in FIG. 14, the cooling plate 143 may be installed between one module and the shaft of the robot in the horizontal direction. In this case, the cooling plate 143 is installed between one module and the shaft of the robot. By employing this configuration, it is possible to cool the first link structure 183, in which heat is most likely to be accumulated, without increasing the footprint of the cooling plate 143. It is also possible to provide a gap on the cover. Therefore, as compared with the structures illustrated in FIGS. 12 and 13, it is possible to more flexibly dispose the temperature sensor 164, the heat transfer gas supply part 150 and the like.

In the foregoing descriptions, there has been described the cooling mode which is performed prior to unloading the wafers 200 from the vacuum transfer chamber. However, the present disclosure is not limited thereto. For example, after the wafers 200 are unloaded from the vacuum transfer chamber, the cooling mode may be performed in a state in which the wafers 200 are mounted on the end effectors 181 and 182. In this case, it may be possible to perform not only the cooling of the arm 180 but also the cooling of the wafers 200. Thereafter, the cooled wafers 200 are transferred. It is therefore possible to further reduce the amount of heat accumulated in the arm 180.

(Substrate Processing Process)

Subsequently, a process of processing the wafers 200 loaded into the respective process chambers will be described in detail, in the present embodiment, the processing common to the respective process chambers will be described using the process chamber 202.

Figure 9:
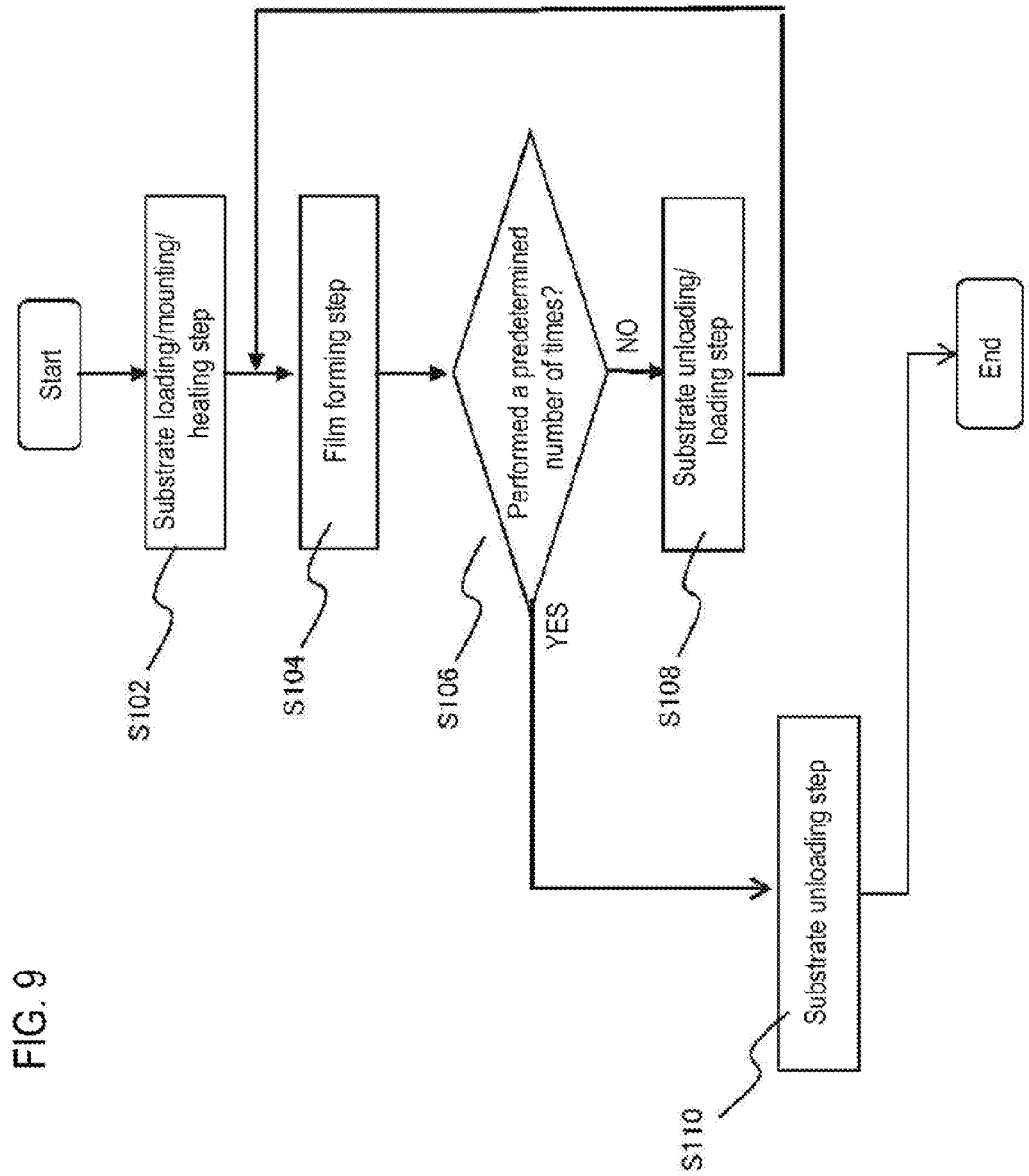
FIG. 9 is a view illustrating a substrate processing flow according to an embodiment of the present disclosure.
Figure 10:
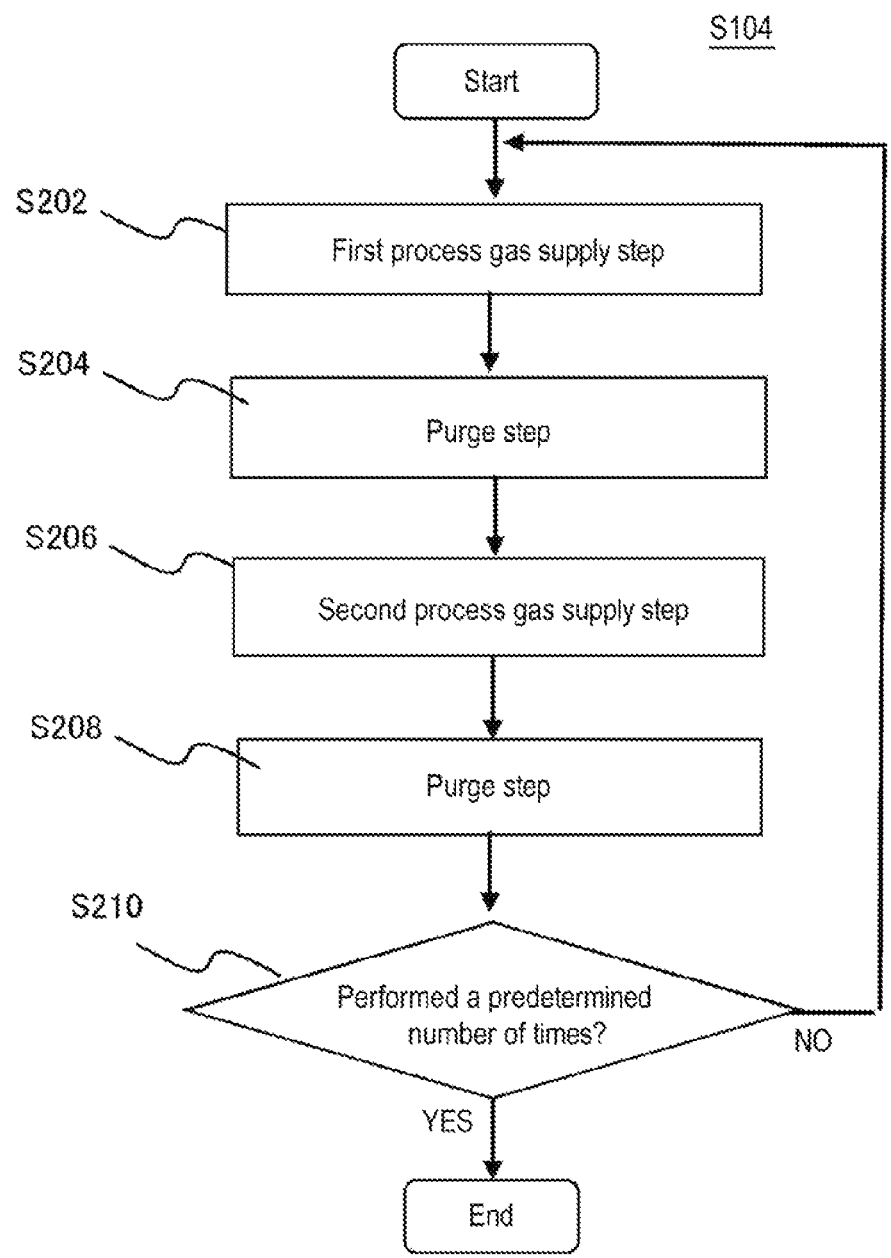
FIG. 10 is a view illustrating a substrate processing flow according to an embodiment of the present disclosure.

FIG. 9 is a flowchart illustrating a substrate processing process according to the present embodiment. FIG. 10 is a flowchart illustrating the details of a film forming step illustrated in FIG. 9.

Hereinafter, descriptions will be made on an example in which a silicon nitride film as a thin film is formed on the wafer 200 using a DCS gas is used as a first process gas and using an ammonia ($NH_3$) gas as a second process gas.

(Substrate Loading/Mounting Step S102)

In the substrate processing apparatus 100, the substrate mounting table 212 is moved down to the transfer position of the wafer 200, thereby allowing the lift pins 207 to penetrate the through-holes 214 of the substrate mounting table 212. As a result, the lift pins 207 protrude by a predetermined height beyond the surface of the substrate mounting table 212. Subsequently, the gate valve 149 is opened to bring the transfer space 206 into communication with the vacuum transfer chamber 140. The wafer 200 is loaded from the vacuum transfer chamber 140 into the transfer space 206 using the arm 190 and is transferred onto the lift pins 207. Thus, the wafer 200 is horizontally supported on the lift pins 207 protruding from the surface of the substrate mounting table 212.

After the wafer 200 is loaded into the process chamber 202, the arm 190 is retracted out of the process chamber 202 and the gate valve 149 is closed to seal the interior of the process chamber 202. Thereafter, the substrate mounting table 212 is moved up so that the wafer 200 is mounted on the substrate mounting surface 211 of the substrate mounting table 212. Furthermore, by moving the substrate mounting table 212 upward, the substrate is moved up to the processing position (substrate processing position) within the aforementioned processing space 205.

If the wafer 200 is loaded into the transfer space 206 and is then moved up to the processing position within the processing space 205, the valve 266 is closed. Thus, the transfer space 206 and the TMP 265 are disconnected and the TMP 265 and the exhaust pipe 264 are disconnected. The evacuation of the transfer space 206 performed by the IMP 265 is completed. On the other hand, the valve 275 is opened to bring the processing space 205 and the APC 276 into communication with each other. The APC 276 adjusts the conductance of the exhaust pipe 262, thereby controlling the exhaust flow rate of the processing space 205 evacuated by the DP 278 and maintaining the internal pressure of the processing space 205 at a predetermined pressure (e.g., at a high vacuum of $10^{-5}$ to $10^{-1}$ Pa).

At this step, an $N_2$ gas as an inert gas may be supplied from the inert gas supply system into the process chamber 202 while evacuating the interior of the process chamber 202. That is, by opening at least the valve 245d of the third gas supply system while evacuating the interior of the process chamber 202 with the TMP 265 or the DP 278, an $N_2$ gas may be supplied into the process chamber 202.

When mounting the wafer 200 on the substrate mounting table 212, electric power is supplied to the heater 213 embedded within the substrate mounting table 212. The heater 213 is controlled so that the surface of the wafer 200 has a predetermined temperature. The temperature of the wafer 200 is, for example, the room temperature or more and 800 degrees C. or less, specifically the room temperature or more and 700 degrees C. or less. At this time, the temperature of the heater 213 is adjusted by controlling the state of supply of electric power to the heater 213 based on the temperature information detected by a temperature sensor (not illustrated).

(Film Forming Step S104)

Next, a film forming step S104 is performed. Hereinafter, the film forming step S104 will be described in detail with reference to FIG. 11. The film forming step S104 is an alternate supply process which repeats a step of alternately supplying different gases.

(First Process Gas Supply Step S202)

If the wafer 200 is heated to a desired temperature, the valve 243d is opened and the mass flow controller 243c is adjusted so that the flow rate of the DCS gas reaches a predetermined flow rate. The flow rate of the DCS gas is, for example, 100 sccm or more and 800 sccm or less. At this time, the valve 245d of the third gas supply system is opened to supply the $N_2$ gas from the third gas supply pipe 245a. Furthermore, the $N_2$ gas may be supplied from the first inert gas supply system. Moreover, the supply of the $N_2$ gas from the third gas supply pipe 245a may be started prior to this step.

The DCS gas supplied to the processing space 205 via the first distribution mechanism 241 is supplied onto the wafer 200. By the contact of the DCS gas with the wafer 200, a silicon-containing layer as a "first-element-containing layer" is formed on the surface of the wafer 200.

The silicon-containing layer is formed at a predetermined thickness and at a predetermined distribution depending on, for example, the internal pressure of the process chamber 202, the flow rate of the DCS gas, the temperature of the substrate mounting table 212, the time required in passing through the processing space 205, and so forth. Furthermore, a predetermined film may be previously formed on the wafer 200. Moreover, a predetermined pattern may be previously formed in the wafer 200 or the predetermined film.

After a predetermined period of time is elapsed from the start of supply of the DCS gas, the valve 243d is closed to stop the supply of the DCS gas. At the step S202 described above, the valve 275 is opened and the pressure of the processing space 205 is controlled by the APC 276 so as to become a predetermined pressure. At the step S202, all the valves of the exhaust system other than the valve 275 are closed.

(Purge Step S204)

Subsequently, the $N_2$ gas is supplied from the third gas supply pipe 245a to purge the shower head 230 and the processing space 205. At this time, the valve 275 is opened and the pressure of the processing space 205 is controlled by the APC 276 so as to become a predetermined pressure. In the meantime, all the valves of the exhaust system other than the valve 275 are closed. Thus, the DCS gas which could not be bonded to the wafer 200 at the first process gas supply step S202 is removed from the processing space 205 via the exhaust pipe 262 by the DP 278.

Subsequently, the $N_2$ gas is supplied from the third gas supply pipe 245a to purge the shower head 230. The valve 275 is closed and the valve 279 is opened. Other valves of the exhaust system are kept closed. That, when purging the shower head 230, the processing space 205 and the APC 276 are disconnected and the APC 276 and the exhaust pipe 264 are disconnected. The pressure control performed by the APC 276 is stopped. On the other hand, the buffer space 232 and the DP 278 are brought into communication with each other. Thus, the DCS gas remaining within the shower head 230 (the buffer space 232) is exhausted from the shower head 230 via the exhaust pipe 263 by the DP 278.

If the purge of the shower head 230 is completed, the valve 275 is opened to resume the pressure control performed by the APC 276, and the valve 279 is closed to disconnect the shower head 230 and the exhaust pipe 264. Other valves of the exhaust system are kept closed. At this time, the supply of the $N_2$ gas from the third gas supply pipe 245a is continuously performed to continuously perform the purge of the shower head 230 and the processing space 205. At the purge step S204, the purge via the exhaust pipe 263 is performed before and after the purge via the exhaust pipe 262. However, only the purge via the exhaust pipe 262 may be performed. In addition, it may be possible to simultaneously perform the purge via the exhaust 262 and the purge via the exhaust pipe 263.

(Second Process Gas Supply Step S206)

After the purge step S204, the valve 244d is opened and the supply of an ammonia gas into the processing space 205 via the shower head 230 is started.

At this time, the mass flow controller 244c is adjusted so that the flow rate of the ammonia gas becomes a predetermined flow rate. The supply flow rate of the ammonia gas is, for example, 100 sccm or more and 6,000 sccm or less. Furthermore, an $N_2$ gas as a carrier gas may be supplied from the inert gas supply system together with the ammonia gas. Moreover, at this step, the valve 245d of the third gas supply system is opened and the $N_2$ gas is supplied from the third gas supply pipe 245a.

The ammonia gas of a plasma state supplied to the process chamber 202 via the first distribution mechanism 241 is supplied onto the wafer 200. The already-formed silicon-containing layer is modified by the ammonia gas. Thus, for example, a layer containing a silicon element and a nitrogen element is formed on the wafer 200.

After a predetermined period of time is elapsed, the valve 244d is closed to stop the supply of the nitrogen-containing gas.

At the step S206, similar to the step S202 described above, the valve 275 is opened and the pressure of the processing space 205 is controlled by the APC 276 so as to become a predetermined pressure. Furthermore, all the valves of the exhaust system other than the valve 275 are closed.

(Purge Step S208)

Subsequently, a purge step similar to the step S204 is performed. Since the operations of the respective parts are the same as those of the step S204, the descriptions thereof are omitted.

(Determination Step S210)

The controller 280 determines whether one cycle described above has been performed a predetermined number of times (n times).

When not performed a predetermined number of times (if NO at step S210), the cycle including the first process gas supply step S202, the purge step S204, the second process gas supply step S206 and the purge step S208 is repeated. When performed a predetermined number of times (if YES at step S210), the process illustrated in FIG. 10 is ended.

Referring back to FIG. 9, a processing times determination step S106 is subsequently performed.

(Processing Times Determination Step S106)

After the film forming step S104, determination is made as to whether the number of performing times of the film forming step has reached a predetermined number of times. If it is determined that the number of performing times of the film forming step has reached a predetermined number of times, the processing is completed. If it is determined that the number of performing times of the film forming step has not reached a predetermined number of times, the flow proceeds to a substrate unloading/loading step S108 in order to start the processing of the next waiting wafer 200, if it is determined that the number of performing times of the film forming step has reached a predetermined number of times, the flow proceeds to a substrate unloading step S110 at which the processed wafer 200 is unloaded.

(Substrate Unloading Step S110)

At the substrate unloading step S110, the substrate mounting table 212 is moved down so that the wafer 200 is supported by the lift pins 207 protruding from the surface of the substrate mounting table 212. Thus, the wafer 200 is moved from the processing position to the transfer position. During this time, the arm 180 is cooled in the cooling mode. Thereafter, the gate valve 149 is opened and the wafer 200 is unloaded out of the process chamber 202 using the arm 180. At this time, the valve 245d is closed to stop the supply of the inert gas from the third gas supply system into the process chamber 202.

Subsequently, if the wafer 200 is moved to the transfer position, the valve 266 is opened and the atmosphere of the transfer space 206 is exhausted by the TMP 265 (and the DP 278). Thus, the process chamber 202 is maintained in a high vacuum (ultra-high vacuum) state (e.g., $10^{-5}$ Pa), thereby reducing a difference in pressure between the process chamber 202 and the vacuum transfer chamber 140 which is similarly maintained in a high vacuum (ultra-high vacuum) state (e.g., $10^{-6}$ Pa).

While the film forming technique has been described above based on different typical embodiments of the present disclosure, the present disclosure is not limited to these embodiments. For example, the present disclosure may be applied to a case where there are performed other substrate processing processes such as a film forming process other than the film forming process illustrated above, a diffusing process, an oxidizing process, a nitriding process, a lithography process, and the like. Furthermore, the present disclosure may be applied to not only the annealing apparatus but also other substrate processing apparatuses such as a film forming apparatus, an etching apparatus, an oxidizing apparatus, a nitriding apparatus, a coating apparatus, a heating apparatus, an the like. Furthermore, some of configurations of a certain embodiment may be replaced by configurations of another embodiment. Configurations of another embodiment may be added to configurations of a certain embodiment. In addition, some of configurations of each of the embodiments may be added with another configuration, removed, or replaced by another configuration.

In the aforementioned embodiment, descriptions have been made by taking the DCS gas as an example of the first-element-containing gas and taking Si as an example of the first element. However, the present disclosure is not limited thereto. For example, the first element may be Ti, Zr, Hf or other elements. Furthermore, while the foregoing descriptions have been made by taking the $NH_3$ gas as an example of the second-element-containing gas and taking N as an example of the second element, the present disclosure is not limited thereto. For example, the second element may be O or other elements.

Second Embodiment

Subsequently, a second embodiment will be described. Since the apparatus configuration of the second embodiment is the same as the apparatus configuration of the first embodiment, the descriptions thereof will be omitted. Descriptions will be made on the transition to the cooling mode which is a differing point.

In the first embodiment, there has been described an example in which the transition to the cooling mode is performed when the processed wafer 200 is unloaded from the process chamber 202. However, the present disclosure is not limited thereto. As in the present embodiment, the temperature of the arm 180 may be monitored and the transition to the cooling mode may be performed if the detected temperature is equal to or higher than a predetermined temperature.

Specifically, the transition to the cooling mode is performed in the following manner. First, the temperature sensor 164 detects the temperature of the arm 180 before the processed wafer 200 is unloaded from the process chamber or after the process wafer 200 is loaded into the load lock chamber 130. The detected temperature information is monitored by the temperature monitoring part 165. The monitored temperature information is transmitted to the controller 280.

The controller 280 receives the temperature information from the transmission/reception part 284 and reads table 3 illustrated in FIG. 16. The comparison part 285 of the controller 280 compares the detected temperature information with a temperature zone T1 and a temperature zone T2. As used herein, the temperature zone T1 refers to a predetermined temperature range. The temperature zone T2 refers to a temperature range which is higher than the temperature zone T1 and which differs from the temperature zone T1.

If the result of comparison reveals that the detected temperature information falls within the range of T1, it is determined that heat is not accumulated in the arm 180. Thus, the vacuum transfer mode is maintained. If the detected temperature information falls within the range of T2, it is determined that heat is accumulated in the arm 180. Then, table 1 or table 2 is read and the transition to the cooling mode is performed.

In this way, the cooling is performed when the temperature of the arm 180 is equal to or higher than a predetermined value. It is therefore possible to perform the transition to the cooling mode at an appropriate timing and to perform the processing without reducing the throughput.

Third Embodiment

Subsequently, a third embodiment will be described. Since the apparatus configuration of the third embodiment is the same as the apparatus configuration of the first embodiment, the descriptions thereof will be omitted. Descriptions will be made on the transition to the cooling mode which is a differing point.

In the first embodiment, there has been described an example in which the transition to the cooling mode is performed when the processed wafer 200 is unloaded from the process chamber 202. However, the present disclosure is not limited thereto. As in the present embodiment, the transition to the cooling mode may be performed after the arm 180 is used a predetermined number of times to transfer the wafer 200.

Specifically, the relationship between the wafer processing temperature, the number of transfer times and the heat-resisting temperature of the arm 180 is made clear by experiments or the like. If the number of transfer times reaches a predetermined number of transfer times, the transition to the cooling mode is performed.

More specifically, the processing is performed as follows. The controller 280 counts the number of transfer times using a counter part 286 installed within the controller 280. Then, table 4 is read from the memory part 282. The comparison part 285 compares the number of transfer times counted by the counter part 286 with the information of table 4. If the result of comparison reveals that the detected number of transfer times is N times or less, it is determined that heat is not accumulated in the arm 180. Thus, the vacuum transfer mode is maintained. If the detected number of transfer times is larger than N times, it is determined that heat is accumulated in the arm 180. Then, table 1 or table 2 is read and the transition to the cooling mode is performed. As used herein, the N times refers to the number of times found by experiments or the like and refers to the number of transfer times at which the temperature of the arm 180 becomes a temperature close to the heat-resisting temperature.

The heat-resisting temperature may be made clear according to some processing patterns by finding the relationship between the wafer processing temperature, the number of transfer times and the heat-resisting temperature of the arm 180 through experiments or the like conducted in advance. For example, in the recent multi-kind and small-lot processing, the following processing pattern is used if the wafer processing temperatures per lot are different.

The accumulation amount of heat varies depending on, for example, the wafer temperature or the number of transfer times as will be described below. When the wafer 200 is heated to a temperature of about 600 degrees C., the heat-resisting property is affected if the wafer transfer is performed about five to six times. Accordingly, the transition to the cooling mode is performed after performing the wafer transfer about six times. When the wafer 200 is heated to a temperature of about 500 degrees C., the heat-resisting property is affected if the wafer transfer is performed about ten times. Accordingly, the transition to the cooling mode is performed after performing the wafer transfer about ten times.

If the processing is performed at different temperatures, the number of transfer times at which the transition to the cooling mode is to be performed becomes different as described above. For example, if the transition to the cooling mode is performed based on the number of transfer times conforming to high-temperature processing, the throughput is reduced at low-temperature processing.

Thus, in the present embodiment, the number of transfer times at which the transition to the cooling mode is to be performed is set depending on the wafer temperature. Specifically, the temperature conditions and the corresponding numbers of transfer times at which the transition to the cooling mode is to be performed are pre-stored in the memory part. The wafer temperature and the number of transfer times at which the transition to the cooling mode is to be performed are selected based on the wafer information received from an apparatus manager or a higher-level apparatus.

By employing the above configuration, the throughput is not reduced even when processing multiple kinds of wafers.

While the cooling plate has been described as an example of the cooling mechanism in the aforementioned embodiments, the present disclosure is not limited thereto. For example, it may be possible to employ a cooling path through which a chiller or the like flows.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a robot including:
      an end effector configured to support a substrate and configured to move up and down,
      a first link structure including a fixing portion having a front end to which the end effector is fixed, a support portion configured to support the fixing portion, and a first hole formed in the support portion,
      a second link structure including a second hole, and
      a shaft inserted into the first hole and the second hole to interconnect the first link structure and the second link structure, the shaft including an upper end having a height equal to or smaller than a height of the substrate mounted on the end effector;
   a vacuum transfer chamber, wherein the robot is installed in the vacuum transfer chamber;
   at least one process chamber disposed adjacent to the vacuum transfer chamber and configured to thermally process the substrate transferred from the vacuum transfer chamber by the robot;
   a module including one or more process chambers;
   a cooling mechanism installed above the first link structure or the shaft and configured to cool the first link structure or the shaft; and
   an elevator configured to move the end effector to a standby position in a cooling mode, the standby position being located vertically closer to the cooling mechanism than a transfer position in which the substrate is transferred.

2. The apparatus of claim 1, wherein the cooling mechanism is installed in an upper wall of a housing of the vacuum transfer chamber.

3. The apparatus of claim 2, wherein the upper end of the shaft is configured to have a height equal to or smaller than a height of an upper end of the end effector.

4. The apparatus of claim 3, wherein a temperature sensor configured to detect a temperature of the first link structure or the shaft is installed in the vacuum transfer chamber, and a cooling mode of the first link structure or the shaft is performed if the temperature sensor detects a predetermined temperature.

5. The apparatus of claim 4, wherein a heat transfer gas supply part configured to supply a heat transfer gas is installed in the vacuum transfer chamber.

6. The apparatus of claim 5, wherein the heat transfer gas is supplied from the heat transfer gas supply part in the cooling mode.

7. The apparatus of claim 6, wherein the cooling mode is performed before unloading the substrate from at least one process chamber.

8. The apparatus of claim 6, wherein the cooling mode is performed after unloading the substrate from at least one process chamber.

9. The apparatus of claim 2, wherein the cooling mechanism is installed above the robot.

10. The apparatus of claim 2, wherein the cooling mechanism is installed over an operation range of the end effector in a horizontal direction.

11. The apparatus of claim 2, wherein the cooling mechanism is installed between the shaft and a substrate loading/unloading gate of at least one process chamber in a horizontal direction.

12. The apparatus of claim 1, wherein a heat transfer gas supply part configured to supply a heat transfer gas is installed in the vacuum transfer chamber.

13. The apparatus of claim 12, wherein a temperature sensor configured to detect a temperature of the first link structure or the shaft is installed in the vacuum transfer chamber, and a cooling mode of the first link structure or the shaft is performed if the temperature sensor detects a predetermined temperature.

14. The apparatus of claim 13, wherein the cooling mode is performed in a state in which the substrate is not mounted on the end effector.

15. The apparatus of claim 13, wherein the heat transfer gas is supplied from the heat transfer gas supply part in the cooling mode.

16. The apparatus of claim 14, wherein the cooling mode is performed before unloading the substrate from at least one process chamber.

17. The apparatus of claim 14, wherein the cooling mode is performed after unloading the substrate from at least one process chamber.

18. A substrate processing apparatus, comprising:
   a robot including:
      an end effector configured to support a substrate and configured to move up and down,
      a first link structure including a fixing portion having a front end to which the end effector is fixed, a support portion configured to support the fixing portion, and a first hole formed in the support portion,
      a second link structure including a second hole,
      a shaft inserted into the first hole and the second hole to interconnect the first link structure and the second link structure, the shaft including an upper end having a height equal to or smaller than a height of the substrate mounted on the end effector, and
      an arm control part configured to control an operation of the shaft;
   a vacuum transfer chamber, wherein the robot is installed in the vacuum transfer chamber;
   a temperature sensor installed in the vacuum transfer chamber and configured to detect a temperature of the first link structure;
   a temperature monitoring part configured to monitor information of the temperature sensor;
   at least one process chamber disposed adjacent to the vacuum transfer chamber and configured to thermally process the substrate transferred from the vacuum transfer chamber by the robot;
a module including one or more process chambers;
a cooling mechanism installed above the first link structure or the shaft and configured to cool the first link structure or the shaft;
an elevator configured to move the end effector to a standby position in a cooling mode, the standby position being located vertically closer to the cooling mechanism than a transfer position in which the substrate is transferred;
a memory part configured to store temperature information of the first link structure and a table which compares operation parameters of the first link structure in a cooling mode;
a comparison part configured to compare contents of the table with the received temperature information and extract an operation parameter in the cooling mode if the temperature information falls within a predetermined temperature range; and
a transmission/reception part configured to receive the temperature information monitored by the temperature monitoring part or transmit the operation parameter extracted by the comparison part to the arm control part.

* * * * *